(12) United States Patent
Kostamo et al.

(10) Patent No.: US 7,067,407 B2
(45) Date of Patent: Jun. 27, 2006

(54) METHOD OF GROWING ELECTRICAL CONDUCTORS

(75) Inventors: Juhana Kostamo, Espoo (FI); Maarten Stokhof, Leuven (BE)

(73) Assignee: ASM International, N.V., Bilthoven (NL)

( * ) Notice: Subject to any disclaimer, the term of this patent is extended or adjusted under 35 U.S.C. 154(b) by 6 days.

(21) Appl. No.: 10/910,881

(22) Filed: Aug. 3, 2004

(65) Prior Publication Data

US 2005/0208754 A1    Sep. 22, 2005

Related U.S. Application Data

(60) Provisional application No. 60/492,486, filed on Aug. 4, 2003.

(51) Int. Cl.
*H01L 21/20* (2006.01)
(52) U.S. Cl. ............... 438/584; 438/585; 438/650; 438/686
(58) Field of Classification Search ........... 438/584
See application file for complete search history.

(56) References Cited

U.S. PATENT DOCUMENTS

| | | | |
|---|---|---|---|
| 4,058,430 A | 11/1977 | Suntola et al. | |
| 4,477,296 A | 10/1984 | Nair | |
| 5,711,811 A | 1/1998 | Suntola et al. | |
| 5,731,634 A | 3/1998 | Matsuo et al. | |
| 5,865,365 A | 2/1999 | Nishikawa et al. | |
| 5,939,334 A | 8/1999 | Nguyen et al. | |
| 5,989,672 A * | 11/1999 | Hayashi ............ | 428/833.2 |
| 6,006,763 A | 12/1999 | Mori et al. | |
| 6,033,584 A | 3/2000 | Ngo et al. | |
| 6,066,892 A | 5/2000 | Ding et al. | |
| 6,124,189 A | 9/2000 | Watanabe et al. | |
| 6,130,123 A | 10/2000 | Liang et al. | |
| 6,268,291 B1 * | 7/2001 | Andricacos et al. ........ | 438/694 |
| 6,303,500 B1 | 10/2001 | Jiang et al. | |
| 6,323,131 B1 | 11/2001 | Obeng et al. | |
| 6,342,277 B1 | 1/2002 | Sherman | |
| 6,346,151 B1 | 2/2002 | Jiang et al. | |
| 6,433,432 B1 | 8/2002 | Shimizu | |
| 6,444,568 B1 | 9/2002 | Sundararajan et al. | |
| 6,464,779 B1 | 10/2002 | Powell et al. | |
| 2001/0003064 A1 | 6/2001 | Ohto | |
| 2001/0018266 A1 | 8/2001 | Jiang et al. | |
| 2001/0052318 A1 | 12/2001 | Jiang et al. | |
| 2002/0004293 A1 * | 1/2002 | Soininen et al. ............ | 438/584 |

(Continued)

FOREIGN PATENT DOCUMENTS

EP    0 469 470 A1    2/1992

(Continued)

OTHER PUBLICATIONS

Peter Singer, "Progress in Copper: A Look Ahead", Semiconductor International, May 1, 2002.*

(Continued)

*Primary Examiner*—Michael Lebentritt
*Assistant Examiner*—Kyoung Lee
(74) *Attorney, Agent, or Firm*—Knobbe Martens Olson & Bear LLP

(57) ABSTRACT

A method for forming a conductive thin film includes depositing a metal oxide thin film on a substrate by an atomic layer deposition (ALD) process. The method further includes at least partially reducing the metal oxide thin film by exposing the metal oxide thin film to a gaseous inorganic reducing agent, thereby forming a metal layer. In preferred arrangements, the reducing agent comprises of thermal hydrogen ($H_2$), hydrogen radicals ($H^*$) and/or carbon monoxide (CO).

34 Claims, 10 Drawing Sheets

U.S. PATENT DOCUMENTS

| | | | |
|---|---|---|---|
| 2002/0006711 A1* | 1/2002 | Yamazaki et al. | 438/471 |
| 2002/0013487 A1 | 1/2002 | Norman et al. | |
| 2002/0027286 A1 | 3/2002 | Sundararajan et al. | |
| 2003/0013302 A1 | 1/2003 | Nguyen et al. | |
| 2003/0135061 A1 | 7/2003 | Norman et al. | |
| 2003/0214043 A1 | 11/2003 | Saitoh et al. | |
| 2004/0087143 A1 | 5/2004 | Norman et al. | |
| 2004/0118697 A1 | 6/2004 | Wen et al. | |

FOREIGN PATENT DOCUMENTS

| | | |
|---|---|---|
| EP | 0 880 168 A2 | 11/1998 |
| WO | WO 93/10652 | 5/1993 |

OTHER PUBLICATIONS

Baklanov et al., "Characterization of Cu surface cleaning by hydrogen plasma," *Journal Vac. Sci. Technol*, Jul./Aug. 2001, pp. 1201-1211, vol. 19, No. 4.

Baliga, "New designs and materials tackle 1 Gb memory challenge," *Semiconductor International*, Nov. 2000.

Basceri, thesis, "Electrical and dielectric properties of (Ba,Sr) $TiO_3$ thin film capacitors for ultra-high density dynamic random access memories," 1997, pp. 13-31, Raleigh, N.C. State University.

Bursky, "Hit up IEDM for gigabit and denser DRAMs and merged logic/memory," *Electronic Design*, Dec. 1, 1998.

Campbell et al., "Titanium dioxide ($TiO_2$)-based gate insulators," *IBM J. Res. Develop.*, May 1999, pp. 383-392, vol. 43, No. 3.

Fukuzumi et al., "Liner-supported cylinder (LSC) technology to realize Ru/$Ta_2O_5$/Ru capacitor for future DRAMs," *IEEE*, IED 2000, 2000, Session 34.

Hones et al., "MOCVD of thin ruthenium oxide films: Properties and growth kinetics," *Chem. Vap. Deposition*, 2000, pp. 193-198, vol. 6, No. 4.

Hu et al., "*In situ* rapid thermal oxidation and reduction of copper thin films and their applications in ultralarge scale integration," *Journal of The Electrochemical Society*, 2001, pp. G669-G675, vol. 148, No. 12.

Inoue et al., "Low thermal-budget fabrication of sputtered-PZT capacitor on multilevel interconnects for embedded FeRam," *IEEE*, IED 2000, 2000, Session 34.

Jung et al., "A novel Ir/$IrO_2$/Pt-PZT-PT/$IrO_2$/Ir capacitor for a highly reliable mega-scale FRAM," *IEEE*, IED 2000, 2000, Session 34.

Kawamoto et al., "The outlook for semiconductor processes and manufacturing technologies in the 0.1-μm age," *Hitachi Review*, 1999, pp. 334-339, vol. 48, No. 6.

Onda et al., "Hydrogen plasma cleaning a novel process for IC-packaging," SEMICON WEST 97, Packaging Materials Conference, 1997, pp. D-1-D-10.

Solanki et al., "Atomic layer deposition of copper seed layers," *Electrochemical and Solic-State Letters*, 2000, pp. 479-480, vol. 3, No. 10.

Utriainen et al., "Studies of metallic thin film growth in an atomic layer epitaxy reactor using M(acac)$_2$(M=Ni, Cu, Pt) precursors," *Applied Surface Science*, 2000, pp. 151-158, vol. 157.

Utriainen et al., "Studies of NiO thin film formation by atomic layer epitaxy," *Materials Science and Engineering*, 1998, pp. 98-103, vol. B54.

Won et al., "Conformal CVD-ruthenium process for MIM capacitor in giga-bit DRAMs," *IEEE*, IED 2000, 2000, Session 34.

Xu et al., "A breakthrough in low-k barrier/etch stop films for copper damascene applications," *Semiconductor Fabtech*, 2000, pp. 239-244, 11th Edition.

Yagishita et al., "Cleaning of copper surface using vapor-phase organic acids," *MRS Proceedings*, MRS Spring 2003 Meeting, Apr. 21-25 2003, Symposium E, Session E3, Paper E3.28.

Yoon et al., "Investigation of $RuO_2$-incorporated Pt layer as a bottom electrode and diffusion barrier for high epsilon capacitor applications," *Electrochemical and Solid-State Letters*, 2000, pp. 373-376, vol. 3, No. 8.

Yoon et al., "Tantalum-ruthenium dioxide as a diffusion barrier between Pt bottom electrode and $TiSi_2$ ohmic contact layer for high density capacitors," *Journal of Applied Physics*, Sep. 1, 1999, pp. 2544-2549, vol. 86, No. 5.

Yoon et al., "Development of an RTA process for the enhanced crystallization of amorphous silicon thin films," *Electrochemical Society Proceedings*, 2000, pp. 337-343, vol. 2000-9.

"Current state of leading edge ULSI process technology and future trends," *NEC Device Technology International*, 1998, pp. 4-8, No. 48.

"Practical integrated circuit fabrication seminar," Integrated Circuit Engineering Corporation, 1998.

"SOI technology: IBM's next advance in chip design," Date unknown.

"Successful development of capacitor technology for next generation memory," Winbond News Release, Dec. 13, 2000, www.winbond.com.

* cited by examiner

METHOD OF GROWING ELECTRICAL CONDUCTORS

PRIORITY APPLICATION

This application claims the benefit of U.S. Provisional Application 60/492,486, filed Aug. 4, 2003, the entire disclosure of which is incorporated by reference herein.

FIELD OF THE INVENTION

The present invention relates generally to the manufacturing of integrated circuits (ICs), and particularly to thin metal layers, such as for seed layers in damascene and dual damascene processes, gate metals of thin film transistors and capacitor electrodes in ICs.

DESCRIPTION OF THE RELATED ART

The atomic layer deposition (ALD) method of depositing thin films has several attractive features including excellent step coverage, even on large areas, and a dense and pinhole-free structure. Therefore, it is of great interest to apply ALD to the deposition of metallization layers of advanced integrated circuits (ICs), where the continuously increasing packing density and aspect ratio set higher and higher demands upon the metallization layers. Applications where high quality metallization is particularly useful include dual damascene structures, gates in transistors and capacitors in ICs. However, due to the fact that ALD is based on sequential self-saturating surface reactions of source chemical compounds and utilization of active surface sites, depositing high quality elemental metal thin films by ALD is very difficult.

In ALD, the source chemical molecules chemisorb on the substrate via active sites on the substrate surface. Typical active sites for metal source chemicals are —OH, —NH$_2$ and —NH groups. Metal-oxygen-metal bridges on the surface may also act as active sites. When a metal source chemical molecule reacts with the active site, a strong bond is formed between the surface and source chemical molecule and the ligand of the source chemical molecule is simultaneously released as a by-product.

In ALD, films grow with a constant growth rate. Each deposition cycle produces about one molecular layer of the deposited material on the substrate surface. Usually the growth rate is well below one molecular layer/cycle because the adsorbed source chemical molecules may be bulky (steric hindrance) or because substrate temperature affects the number of active sites (e.g., —OH groups) on the surface. It is well known that metal oxide thin films produced by ALD are uniform, have excellent adhesion and thus are firmly bonded to the substrate surface.

In contrast to metal oxide films, experiments have revealed a drawback of the growth of metal thin films by an ALD type method. In the case of metal deposition it is difficult to attach source chemical molecules to the surface because few active sites exist on the surface. The metal film grown is often non-uniform over an area of the substrate and it is easily peeled off from the surface, which indicates very poor adhesion of the film to the substrate.

Several attempts have been made to produce metal thin films by ALD type methods. Reproducibility of such an ALD metal growth process has traditionally been poor and the reactions do not take place at all on insulating surfaces like silicon oxide. There are publications about the ALD deposition of Cu metal by pulsing a copper compound, e.g., Cu(thd)$_2$, on a surface and then reducing the Cu(thd)$_2$ molecules bound to the surface into Cu with H$_2$.

R. Solanki et al. (Electrochemical and Solid-State Letters 3 (2000) 479–480) have deposited copper seed layers by ALD. They deposited copper directly from alternate pulses of bis(1,1,1,5,5,5-hexafluoroacetylacetonato)copper(II)hydrate and either methanol, ethanol or formalin, i.e., a water solution of formaldehyde. The total pulsing cycle time was 64 s, i.e., slightly over one minute. Although the growth rate was not mentioned in the publication, a typical growth rate of a thin film made by ALD from metal β-diketonates is 0.03 nm/cycle due to the steric hindrance of the source chemical molecules. Thus, the deposition time for a 10 nm copper seed layer would be over 5 hours, which is uneconomical for wafer processing. A commercially acceptable minimum throughput of a wafer reactor is 10–12 wafers/hour. It is to be noted that according to Strem Chemicals, Inc. the decomposition temperature of the copper compound used by R. Solanki et al. is 220° C. R. Solanki et al. noticed copper film growth when the substrate temperature was 230–300° C. Therefore, partial thermal decomposition of copper source compound (contrary to ALD self-limiting surface reaction principles) on substrate surface is probable.

One of the most advanced IC structures is the dual damascene structure for interconnecting integrated circuit devices such as transistors (which include source, gate and drain). Several electrically conducting layers are needed in the structure. The first metallization level is done with tungsten plugs and aluminum interconnects to prevent the contamination of the gate with copper. The remainder of the metallization levels are made of copper in state-of-the-art ICs, to maximize conductivity and thus circuit speed.

There are several ways of making dual damascene structures. An example of the process steps of a dual damascene process is described below.

Step 1. A silicon nitride etch stop is grown on the previous metallization surface.

Step 2. A via level dielectric is deposited.

Step 3. Another silicon nitride etch stop is deposited.

Step 4. A trench level dielectric is deposited. SiO$_2$ has been favored as the dielectric material and the examples below assume some form of SiO$_2$ for the trench- and via-level dielectrics. Low-k materials such as carbon-doped silicon oxide and polymers have been experimented with as alternative dielectric materials.

Step 5. Patterning of the dielectric layers by photolithography.
  a. A resist layer is deposited on dielectric stack's surface.
  b. The resist layer is patterned and the resist is removed from the via areas.
  c. The level dielectric is etched from the via areas with directional plasma etching, terminating at the upper silicon nitride etch stop surface.
  d. Resist is stripped from the surface.

Step 6. Patterning of the etch stop layer by photolithography.
  a. A second resist layer is deposited on the surface.
  b. The resist layer is patterned and it is removed from the trench areas.
  c. The upper silicon nitride is removed with a short plasma nitride etch from the bottom of the holes that were made with the first plasma oxide etch, creating a buried hard mask.
  d. The second plasma oxide etch removes silicon dioxide from the exposed via and trench areas until the silicon nitride etch stop layers are reached.

e. The lower silicon nitride etch stop is removed from the via bottom and the upper silicon nitride etch stop from the trench bottom with a short plasma nitride etch.

f. The resist is stripped from the substrate.

Step 7. The surface of the substrate is cleaned.

Step 8. A diffusion barrier layer is grown on all exposed surfaces.

Step 9. A seed layer for copper deposition is grown with CVD or PVD on the diffusion barrier layer.

Step 10. Vias and trenches are filled with bulk copper, such as by an electroplating process.

Step 11. The substrate surface is planarized with chemical mechanical polishing (CMP). The surface is polished until copper and a barrier layer are left only in trenches and vias.

Step 12. The surface is capped with a silicon nitride etch stop layer.

Step 13. The metallization process is then repeated for all the remaining metallization levels.

Alternatives for copper electroplating (Step 10) are electroless plating, physical vapor deposition (PVD), metal organic chemical vapor deposition (MOCVD) and copper superfill that is based on a catalyzed MOCVD process. A seed layer (c.f. Step 9) is typically needed for electroplating processes. The seed layer is advantageous also for CVD processes because it can act as a nucleation layer for the thin film deposition by the CVD processes. Traditionally such a seed layer is deposited by chemical vapor deposition (CVD) or physical vapor deposition (PVD). In the electroplating process the substrate having an electrically conductive seed layer is immersed in a metal compound solution. The electrically conductive surface of the substrate is connected to an external DC power supply. A current passes through the substrate surface into the solution and metal is deposited on the substrate. The seed layer has high electrical conductivity and it acts as a current conduction and nucleation layer for the electroplating process. The seed layer carries current from the edge of the wafer to the center of the wafer and from the top surface of the wafer into the bottom of vias and trenches. A uniform and continuous seed layer is necessary to get uniform electroplated copper. Electrical contact is made to the seed layer. The quantity of the deposited metal is directly proportional to the local current density on the substrate.

The benefits of copper compared to aluminum are lower resistivity and better resistance to electromigration. Furthermore, since tighter packing density can be obtained with copper, fewer metallization levels are needed and the manufacturing costs are lower than with aluminum. With increasing aspect ratio it is becoming difficult to get sufficient step coverage for the seed layer with the state of the art technology.

In dynamic random access memories (DRAM), capacitors store data bits in the form of electrical charge. These memory capacitors must be recharged frequently due to charge leakage. The simplest capacitor consists of two parallel metallic plates separated with a dielectric material. The capacity (C) of this plate capacitor depends according to equation (I) on the area (A) of the metallic plate, the distance (d) between the metallic plates and the dielectric constant (k) of the dielectric material. $\epsilon_0$ is the permittivity of space.

$$C = k\epsilon_0 A/d \quad (I)$$

Cylindrical capacitors are often used. The conductors are arranged coaxially. The charge resides on the inner surface of the outer conductor or on both the inner surface of the outer conductor and on the outer surface of the inner conductor. In this case the capacitance (C) depends on the radius of the outer surface of the inner conductor (a), radius of the inner surface of the outer conductor (b), length of the cylinder (l) and dielectric constant (k) of the dielectric material between the conductors as shown in equation (II).

$$C = 2\pi k\epsilon_0 l/\ln(b/a) \quad (II)$$

The feature sizes in DRAMs are decreasing continuously. The capacitors must be made smaller in successive DRAM generation. In order to save surface area, planar capacitors are being replaced with vertical coaxial capacitors that may have aggressive aspect ratios. However, with scaling the footprint available for each capacitor is reduced. For a given capacitor size, the charge storing area is reduced, such that the distance between the conductors must be decreased and/or the dielectric constant of the dielectric must be increased in order to keep the capacity sufficient. Decreasing the distance between the conductors causes voltage breakdown when the insulator thickness is too thin to hold the voltage.

Using high-k dielectrics, such as $TiO_2$ and $Ta_2O_5$, resolves the above-described problem related to decreasing feature size. However, the aforementioned high-k dielectrics create new problems, since they donate oxygen to the conductor and thus the capacitor properties deteriorate. Therefore, inert metals, such as platinum group metals, or conductive metal oxides, such as $RuO_2$, are favored for the electrode surfaces adjacent to the high-k metal oxides. But it is difficult to deposit thin films with good step coverage on new capacitor structures with small feature size and aggressive aspect ratio. As a conclusion, there is an increasing need for a method of producing conductive thin films with good step coverage and excellent thin film properties, such as adhesion to the substrate.

S.-J. Won et al. have presented a metal-insulator-metal (MIM) capacitor structure for giga-bit DRAMs (Technical Digest of the 2000 International Electron Devices Meeting (IEDM), San Francisco, Calif., Dec. 10–13, 2000). They used $Ta_2O_5$ as the capacitor dielectric while the electrodes consisted of ruthenium deposited by CVD from $Ru(EtCp)_2$ and gaseous oxygen at 300–400° C. Problems related to the method included poor step coverage and reaction speed sensitivity. When the nodes were made with 0.08 μm design rules, the step coverage dropped to 60%. The reaction of $Ru(EtCp)_2$ with $O_2$ was adversely affected by the partial pressures of the compounds.

$N^+$ or $p^+$ doped polycrystalline silicon (poly-Si) has been used as a gate electrode for transistors. However, several problems are associated with the use of poly-Si gate electrodes. In the case of boron-doped $p^+$ poly-Si, the diffusion of boron through the gate $SiO_2$ destroys the electrical properties of the transistor. Poly-Si is thermodynamically unstable against high dielectric constant materials at high processing temperatures. In addition, poly-Si has rather high resistivity compared to metals. There is a tendency to replace the $SiO_2$ gate oxide with a high dielectric constant metal oxide. A metal with appropriate work function would enable the tailoring of the CMOS threshold voltage. Refractory metals have been suggested for gate metals but the stability of the metal—gate oxide interface has been an issue. Platinum group metals are potential candidates for gate metals due to their inert nature. However, appropriate methods of depositing high-quality platinum group metal thin films for gate electrode applications have not yet been developed.

M. Utriainen et al. have demonstrated (Appl. Surf. Sci. 157 (2000) pp. 151–158) that ALD grown metal oxides can be used as interconnects in ICs after reducing the metal oxides into metals. They studied the direct ALD deposition of Cu, Ni and Pt metals and the indirect Ni metal growth method via reduction of NiO. However, they had problems with the quality of the nickel film: pinholes were formed on the thin films during the reduction of NiO with hydrogen gas.

SUMMARY OF THE INVENTION

Embodiments described herein provide methods of producing high quality conductive thin films with excellent step coverage, uniform thickness over a large area and excellent adhesion properties. The thin films may be used, for example, as seed layers for the electrodeposition of metal layers, as gate metals in thin film transistors and as capacitor electrodes for advanced high-density integrated circuits.

The present method is particularly applicable to the manufacture of conductive thin films, preferably comprising one or more of the following elements: rhenium, ruthenium, osmium, cobalt, rhodium, iridium, nickel, palladium, platinum, copper, silver and gold.

According to one embodiment described herein, a method of forming a conductive thin film comprises depositing a metal oxide thin film on a substrate by an atomic layer deposition (ALD) process. The method further comprises at least partially reducing the metal oxide thin film by exposing the metal oxide thin film to a gaseous inorganic precursor, thereby forming a seed layer. In certain embodiments, the reduction of the metal oxide thin film essentially converts the metal oxide into an elemental metal seed layer that has sufficient electrical conductivity to be used for subsequent electrochemical deposition. In other embodiments, the reduction of the metal oxide thin film essentially converts the metal oxide into an elemental metal seed layer that can be used as a nucleation layer for the subsequent deposition of bulk metal by CVD and MOCVD processes.

According to another embodiment described herein, a method of producing a conductive thin film comprises the steps of (A) placing a substrate in a chamber and (B) exposing the substrate to a vapor phase first reactant. The first reactant adsorbs no more than a monolayer of metal species on the substrate. The method further comprises (C) removing excess first reactant from the chamber and (D) exposing the substrate to a second vapor phase reactant comprising a compound that is capable of oxidizing the adsorbed metal species on the substrate into metal oxide. The method further comprises (E) removing excess second reactant from the chamber and (F) repeating the above steps B through E at least three times to form a metal oxide film of desired thickness. The method further comprises (G) following step F, exposing the substrate to a gaseous inorganic precursor to reduce the metal oxide film to a metal film.

According to still another embodiment described herein, a method of producing a conductive thin film comprises depositing a metal oxide thin film of at least 0.6 nm thickness on a substrate. The method further comprises reducing said metal oxide thin film to metal thin film by exposing the metal oxide thin film to a gaseous inorganic precursor.

According to yet another embodiment described herein, a method of producing a conductive thin film comprises depositing a metal oxide thin film on a substrate by an atomic layer deposition (ALD) process. The method further comprises at least partially reducing the metal oxide thin film to an elemental metal film. In certain embodiments, the metal oxide thin film is at least partially reduced by exposing the metal oxide thin film to a gaseous inorganic precursor.

According to another embodiment described herein, a method of producing a conductive thin film comprises depositing a metal oxide thin film on a substrate by an atomic layer deposition (ALD) process. The method further comprises at least partially reducing the metal oxide thin film to elemental metal film in a CVD tool.

Certain embodiments described herein are especially beneficial for making electrically conductive layers in structures that have high aspect ratios, like vias, trenches, local high elevation areas and other similar surface structures that make the surface rough and complicate thin film processing by conventional CVD and PVD methods. An ALD metal oxide process combined with a reduction step provides excellent step coverage of electrically conductive thin films on all surface formations.

DETAILED DESCRIPTION OF THE DRAWINGS

Figure 1:
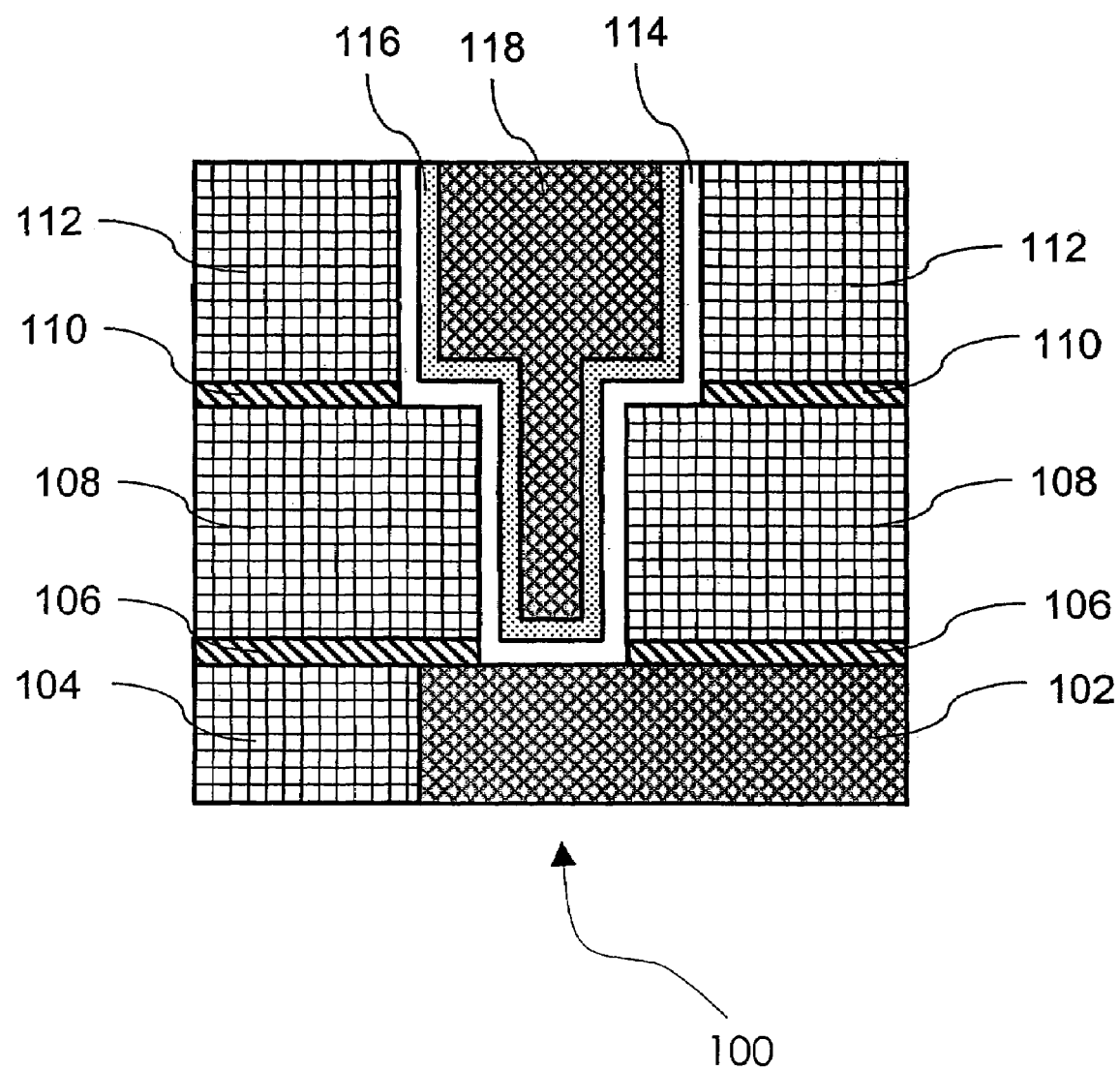
FIG. 1 is a schematic view of a dual damascene structure.

The dual damascene structure 100 shown in FIG. 1 includes an underlying metallization layer 102 (e.g., Cu), an insulating layer 104 (e.g., $SiO_2$), a via etch stop 106 (e.g., $Si_3N_4$), a via level insulator 108 (e.g., $SiO_2$), a trench etch stop 110 (e.g., $Si_3N_4$), a trench level insulator 112 (e.g., $SiO_2$), a diffusion barrier 114 (e.g., TaN), a seed layer 116 (not shown to scale) and a via/trench fill metal 118 (bulk metal, e.g., Cu).

Figure 2:
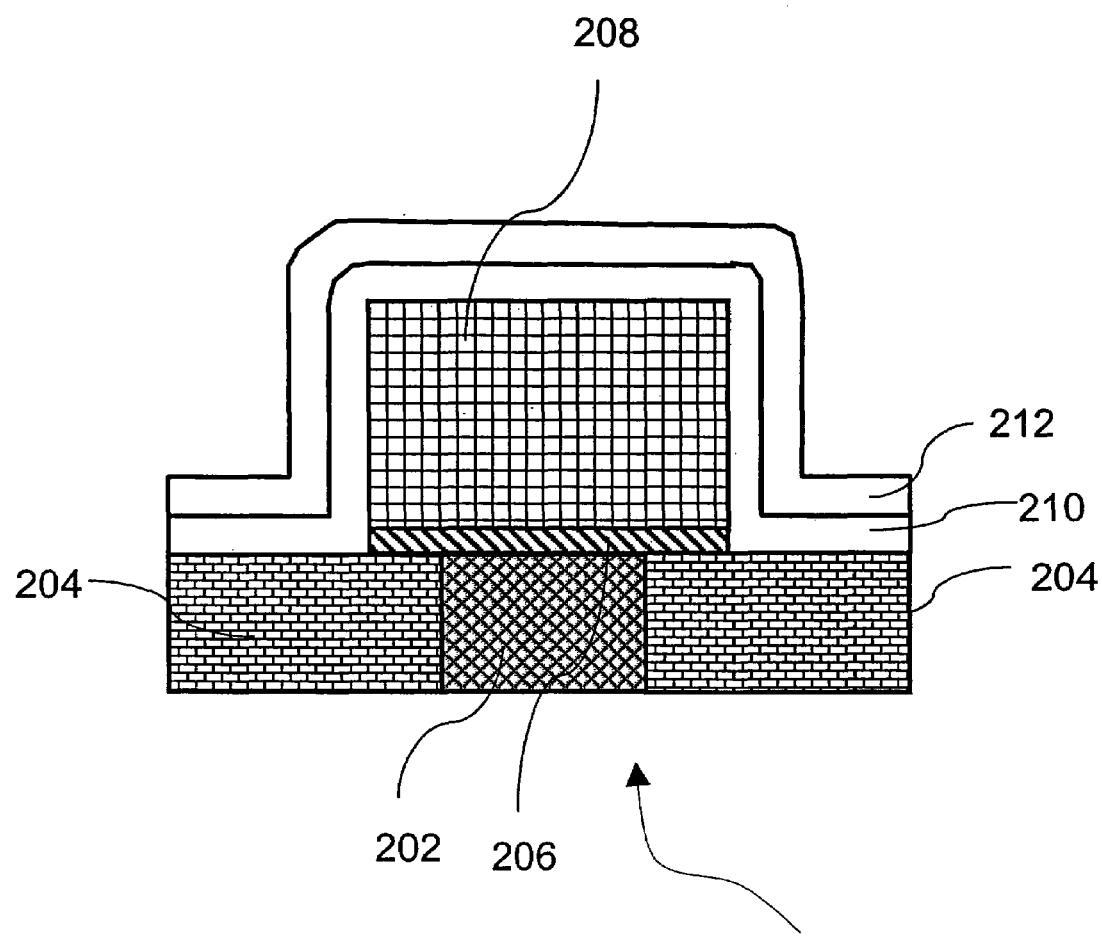
FIG. 2 is a schematic view of a capacitor structure.

The capacitor structure 200 shown in FIG. 2 includes a contact plug 202 (e.g., tungsten (W) or polysilicon), an insulator 204, an optional diffusion barrier 206 (e.g., TiN), a lower electrode 208 (e.g., Ru, Pt, or $RuO_2$), a high-k dielectric film 210 (e.g., barium strontium titanate (BST)), and an upper electrode 212 (e.g., Ru or Pt).

Figure 3:
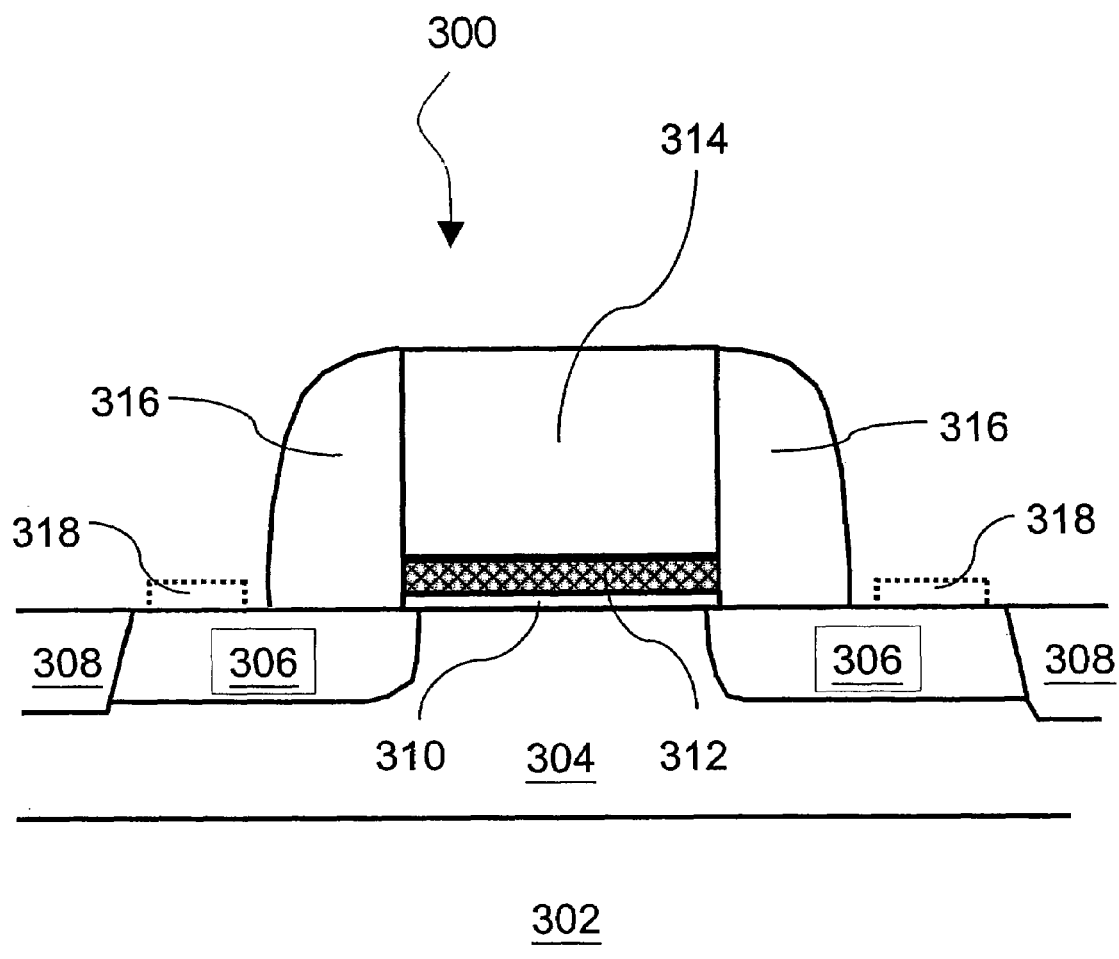
FIG. 3 is a schematic view of an NMOS transistor suitable for CMOS structures.

The partial transistor structure 300 shown in FIG. 3 includes a substrate 302, an n-type well 304, a p-type diffusion region 306 (right drain, left source), a shallow trench isolation oxide 308, a gate dielectric 310, an optional barrier layer 312, a gate metal 314, gate isolation spacers 316, and contact areas for tungsten plugs 318. The contact areas are shown dotted because they are not in the same vertical plane with the other numbered parts. A CMOS structure contains both PMOS and NMOS transistors. The contact areas against P-type semiconductor can be made of, e.g., Ni, or RuO. The contact areas against N-type semiconductor can be made of, e.g., Ru. Platinum can also be applied under W plugs. The choice of the metal or electrically conductive metal compound depends on the work function of the underlying layer and the reactivity of the surrounding materials with the metal or electrically conductive metal compound.

Figure 4:
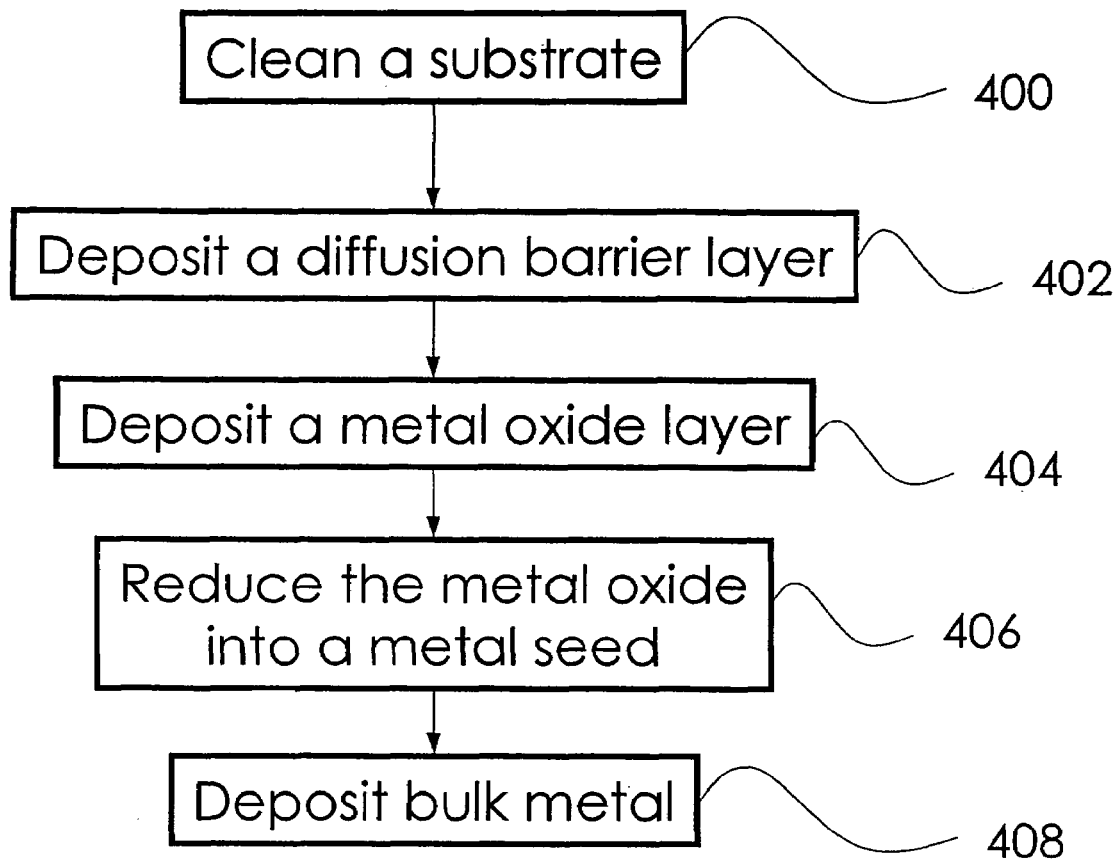
FIG. 4 depicts a general sequence of processes.

A typical process sequence shown in FIG. 4 consists of cleaning of a substrate 400, deposition of a diffusion barrier 402, deposition of a metal oxide layer 404, reduction of the metal oxide layer into a metal seed layer 406 and deposition of bulk metal 408.

Figure 5:
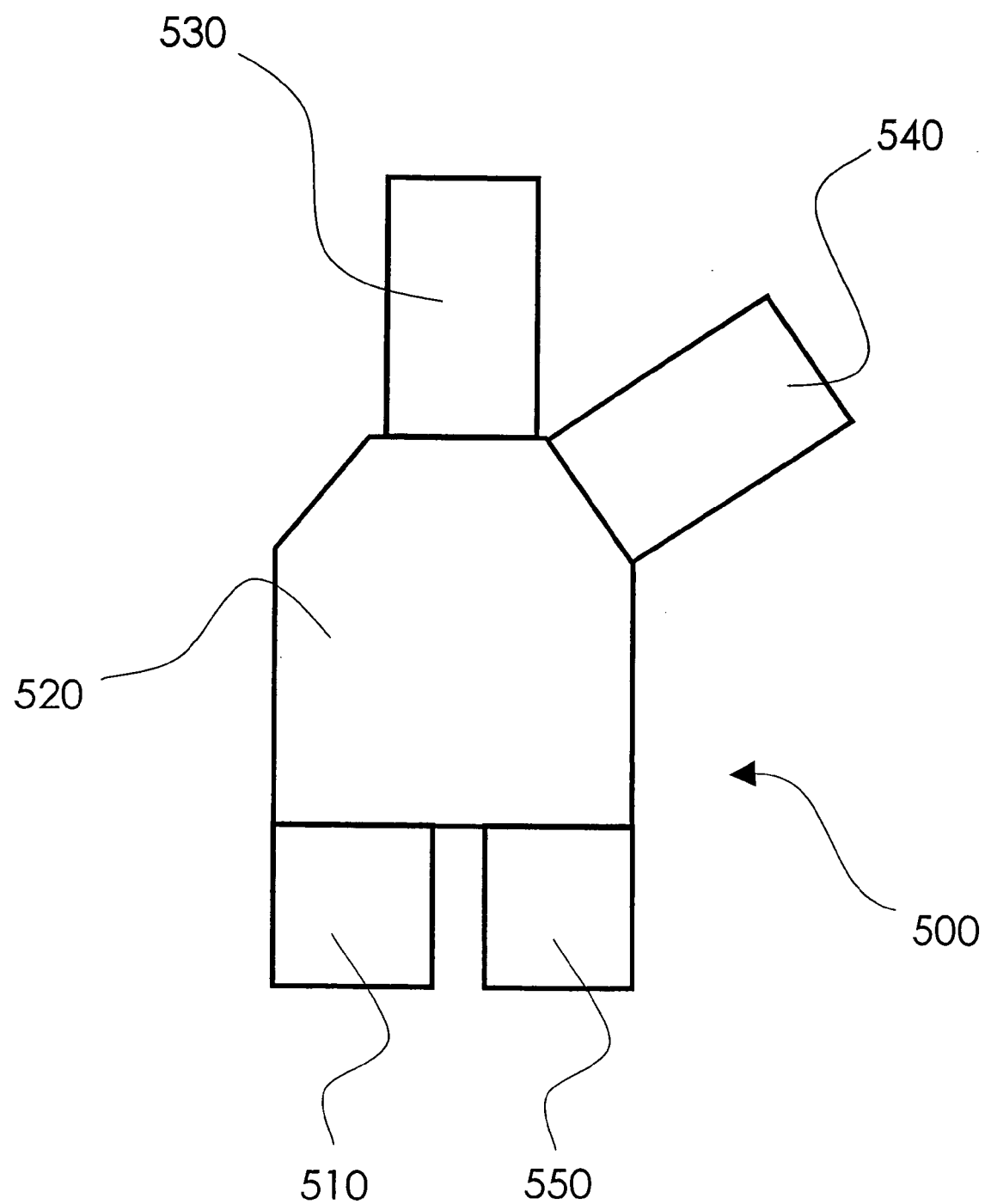
FIG. 5 schematically illustrates a first cluster tool in accordance with embodiments of the present invention.

FIG. 5 schematically illustrates a first cluster tool 500 that consists of load locks 510, 550, vacuum transport module 520, a first reaction chamber 530 and a second reaction chamber 540.

Figure 6:
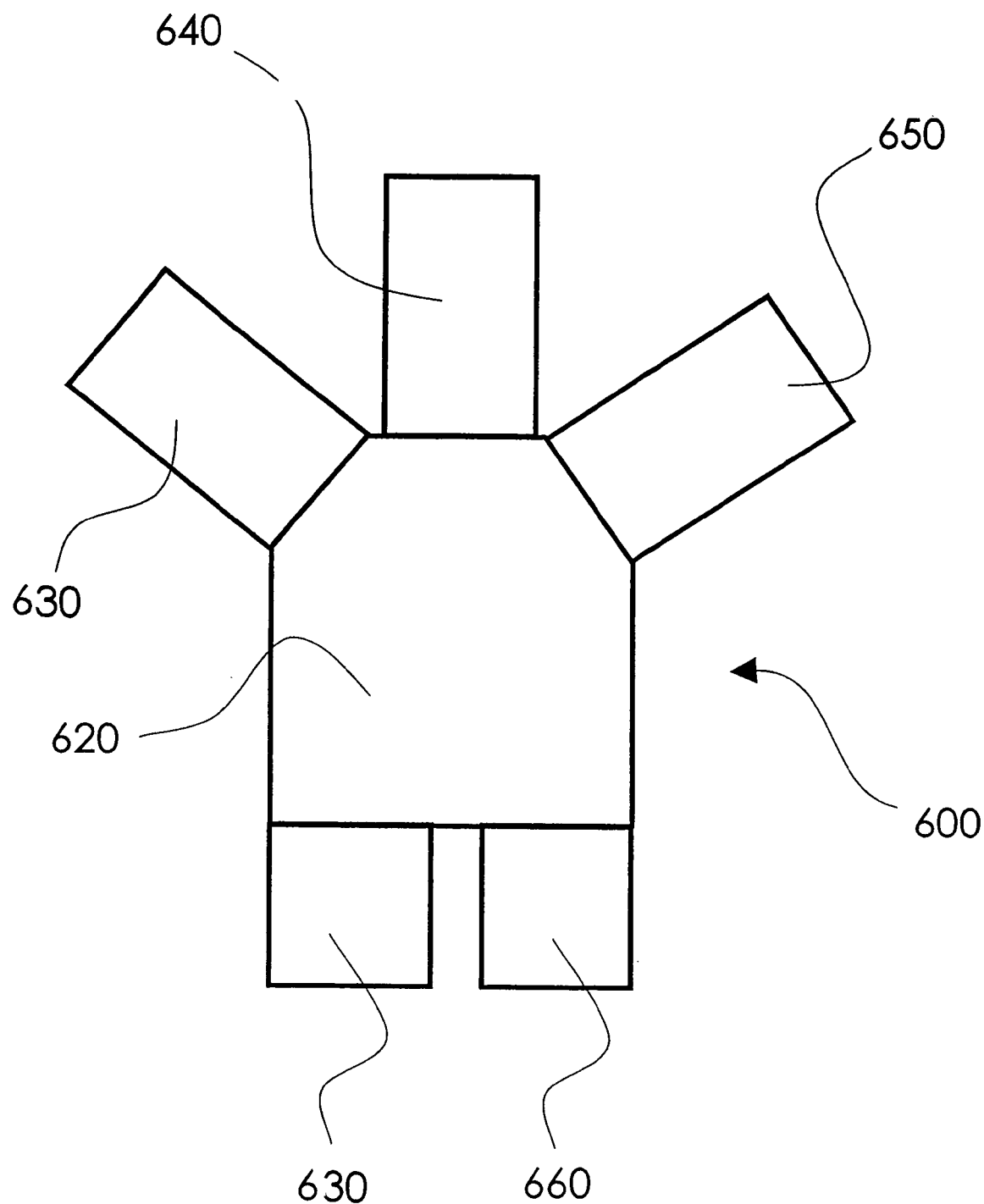
FIG. 6 schematically illustrates a second cluster tool in accordance with embodiments of the present invention.

FIG. 6 schematically illustrates a second cluster tool 600 that consists of load locks 610, 660, a vacuum transport module 620, a first reaction chamber 630, a second reaction chamber 640 and a third reaction chamber 650.

DETAILED DESCRIPTION OF THE PREFERRED EMBODIMENTS

A layer of a low volatility oxide of a metal is grown on a substrate. Preferably the metal oxide is grown on the substrate according to the principles of an ALD process, and the following disclosure is directed to this embodiment. However, the skilled artisan will recognize that other methods of depositing a metal oxide thin film may be used in the methods. After the ALD process, the thin film consists essentially of a metal oxide or a mixture of metal oxides. The metal oxides are at least partially converted into a metal in a separate process step to increase the electrical conductivity of the deposited oxide thin film. The conversion step can be done with any inorganic reducing agent capable of forming a stronger bond to oxygen than the metal to be reduced. Preferably, the reducing agent is in the gaseous phase. However, in the case of silver and gold oxides, the conversion step can also be done simply by heating to decompose the oxide into metal and oxygen.

The following low volatility metal oxides and mixtures and nanolaminates of the following metal oxides are examples of compounds that are suitable for conversion into a conductive form by the method of certain embodiments: $ReO_2$, $Re_2O_5$, $ReO_3$, $RuO_2$, $OsO_2$, $CoO$, $Co_3O_4$, $Rh_2O_3$, $RhO_2$, $IrO_2$, $NiO$, $PdO$, $PtO_2$, $Cu_2O$, $CuO$, $Ag_2O$ (decomposes at temperatures above about 230° C.), $Au_2O_3$ (decomposes at temperatures above about 160° C.). However, a person skilled in the art will understand that embodiments described herein are not limited to these metal oxides, in part because the stoichiometry may vary in metal oxide films. In addition, the following high-volatility metal oxides exist: $Re_2O_7$, $RuO_4$ and $OsO_4$.

A metal oxide layer is preferably produced by an ALD process. A typical ALD process comprises the following steps:

1. placing a substrate into a reaction chamber;
2. adjusting the pressure and temperature of the reaction chamber, before or after placement of the substrate;
3. feeding into the reaction chamber and contacting the substrate with a pulse of at least one first source chemical, preferably in the vapor phase, comprising a compound capable of adsorbing no more than a monolayer of metal species on the substrate;
4. removing gases from the chamber (e.g., by purging);
5. feeding into the reaction chamber and contacting the substrate with a pulse of at least one second source chemical, preferably in the vapor phase, comprising a compound capable of oxidizing the metal species on the substrate into a metal oxide;
6. removing gases from the chamber (e.g., by purging); and
7. repeating steps 3 through 6 until a desired thickness of the growing thin film is reached.

According to the ALD principles, the previous reactant (i.e., previously pulsed source chemical) and the gaseous by-products of the surface reaction are removed from the reaction chamber before the next pulse of a reactant is introduced into the reaction chamber. The reactants and the by-products can be removed from the reaction chamber by pumping down the chamber to a higher vacuum by a vacuum pump, by purging the chamber with an inert gas pulse, or by a combination of the two. In certain embodiments an inert gas is continuously flowing through the reaction space and one reactant at a time is injected in gaseous form to the flowing inert gas. The injections of different reactants are separated in time from each other so that there is only one reactant present in the gas phase of the reaction space at a time.

In the methods of certain embodiments described herein, the ALD cycle described above is preferably repeated at least 3 times, more preferably at least 10 times prior to reduction. A metal oxide thin film of at least about 0.6 nm is preferably formed on the substrate before it is at least partially reduced with the inorganic reducing agent.

"Metal species" in the context of the present application means a separate molecule, atom or ion comprising one or more metal atoms.

According to one embodiment (FIG. 1), a substrate with open trenches and vias is provided into an ALD reaction chamber. A diffusion barrier layer 114 (e.g., WNC) is provided on the surfaces of the substrate. The pressure of the reaction chamber is adjusted to about 5–10 mbar with a vacuum pump and flowing nitrogen gas. A metal oxide thin film is grown on the diffusion barrier 114 by ALD from alternate pulses of a metal source chemical and oxygen source chemical. Surplus source chemical and reaction by-products are removed essentially entirely from the reaction chamber after each source chemical pulse before the next source chemical pulse is introduced into the reaction chamber and contacted with the substrate surface. The pulsing cycle is repeated, preferably until the thickness of the metal oxide film is sufficient to produce a metal film for seed layer purposes. The metal oxide film is subsequently reduced into a metal layer and used as a seed layer 116 for an electroplating process, an MOCVD process or a copper superfill process.

According to a second embodiment (FIG. 2), a substrate is provided into a reaction chamber of an ALD reactor. The substrate is heated to a deposition temperature of selected metal oxide. Alternate gas phase pulses of a metal source chemical and an oxygen source chemical are introduced into the reaction chamber and contacted with the substrate surface. A metal oxide film is thus grown by ALD on the surface. The metal oxide is used as the first electrode 208 of a capacitor or converted into corresponding metal and used as the first electrode 208 of the capacitor. Then a thin film of a high-k dielectric material 210 is grown on the first electrode 208. The high-k layer 210 is optionally annealed. A second metal oxide thin film is grown by ALD on the high-k layer. The metal oxide film is converted into corresponding metal and used as the second electrode 212 of a capacitor.

However, the metal oxide thin film can be used as the second electrode of the capacitor if the conductivity of the metal oxide thin film is sufficiently high.

In certain embodiments, the metal oxide thin film is used as the second electrode when its resistivity is preferably less than about 500 µΩ-cm, more preferably less than about 300 µΩ-cm, and most preferably less than about 100 µΩ-cm. An example of a suitable metal oxide is ruthenium dioxide ($RuO_2$), which has a resistivity of about 35 µΩ-cm.

According to a third embodiment (FIG. 3), a substrate is provided into a reaction chamber of an ALD reactor. The surface may be, for example, a transistor gate oxide 310 or doped silicon in source and drain areas 306. The substrate is heated to a deposition temperature. Alternate gas phase pulses of a metal source chemical and an oxygen source chemical are introduced into the reaction chamber and contacted with the substrate surface. Metal oxide film is thus grown by ALD on the surface. The metal oxide is used as the gate electrode 314 of a transistor as such or converted into the corresponding metal and used as the gate electrode 314 of a transistor. The metal is also used as an intermediate layer 318 between silicon and tungsten plugs on the source and the drain areas 306 of the transistor.

When depositing silver and gold oxides by ALD, special attention is paid to the selection of growth temperatures, since $Ag_2O$ decomposes into Ag and $O_2$ at about 230° C. and $Au_2O_3$ decomposes into Au and $O_2$ at about 160° C. Therefore, the deposition temperature of silver oxide is preferably kept below 230° C. and the deposition temperature of gold oxide is preferably below 160° C.

The Source Chemicals

The ALD source chemicals must have sufficient volatility at the source temperature to saturate the substrate surface. The vapor pressure of the source chemical should be at least about 0.02 mbar at the source temperature to enable reasonably short pulse times for saturating the substrate surfaces. The metal source chemicals should also be thermally stable at the deposition temperature to prevent particle formation in the gas-phase of the reaction chamber.

Suitable metal source compounds are sold, for example, by Strem Chemicals, Inc. (7 Mulliken Way, Dexter Industrial Park, Newburyport, Mass., USA) and Tri Chemical Laboratory, Inc. (969 Helena Drive, Sunnyvale, Calif., USA).

Low oxidation state rhenium oxide can be grown by ALD for example from following rhenium compounds:
rhenium(VII)oxide ($Re_2O_7$), rhenium pentacarbonyl chloride ($Re(CO)_5Cl$), methyltrioxorhenium(VII) ($CH_3ReO_3$), cyclopentadienylrhenium tricarbonyl (($C_5H_5$)Re(CO)$_3$), pentamethylcyclopentadienylrhenium tricarbonyl ([($CH_3$)$_5C_5$]Re(CO)$_3$), and i-propylcyclopentadienylrhenium tricarbonyl (($C_3H_7$)$C_5H_4$Re(CO)$_3$).

Low oxidation state ruthenium oxide can be grown by ALD for example from following ruthenium compounds:
ruthenium(VIII)oxide ($RuO_4$), bis(cyclopentadienyl)ruthenium (($C_5H_5$)$_2$Ru), bis(pentamethylcyclopentadienyl)ruthenium ([($CH_3$)$_5C_5$]$_2$Ru), cyclopentadienylruthenium dicarbonyl (($C_5H_5$)$_2$Ru(CO)$_2$), bis(2,2,6,6-tetramethyl-3,5-heptanedionato) (1,5-cyclooctadiene)ruthenium(II) ($C_{11}H_{19}O_2$)$_2$($C_8H_{12}$)Ru, tris(dipivaloylmethanato)ruthenium i.e. tris(2,2,6,6-tetramethyl-3,5-heptanedionato)ruthenium (Ru(DPM)$_3$ or Ru(thd)$_3$), anhydrous ruthenium-nitrate (Ru(NO$_3$)$_3$), and anhydrous ruthenium (III) nitrosyl nitrate (Ru(NO)(NO$_3$)$_3$).

Low oxidation state osmium oxide is preferably grown by ALD for example from following osmium compounds: bis(cyclopentadienyl)osmium(($C_5H_5$)$_2$Os), bis(pentamethylcyclopentadienyl)osmium ([($CH_3$)$_5C_5$]$_2$Os), and osmium (VIII)oxide ($OsO_4$).

Cobalt oxide is preferably grown by ALD for example from following cobalt compounds:
bis(cyclopentadienyl)cobalt(II) (($C_5H_5$)$_2$Co), bis(methylcyclopentadienyl)cobalt(II) (($CH_3C_5H_4$)$_2$Co), bis(pentamethylcyclopentadienyl)cobalt(II) ([($CH$)$_3C_5$]$_2$Co), cobalt tricarbonyl nitrosyl (Co(CO)$_3$NO), cyclopentadienylcobalt dicarbonyl $C_5H_5CO(CO)_2$, cobalt(III)acetylacetonate (Co($CH_3$COCHCOCH$_3$)$_3$), tris(2,2,6,6-tetramethyl-3,5-heptanedionato)cobalt(III) i.e. tris(dipivaloylmethanato) cobalt (Co(TMHD)$_3$, or Co(DPM)$_3$, or Co(thd)$_3$, or Co($C_{11}H_{19}O_2$)$_3$), and anhydrous cobalt nitrate (Co(NO$_3$)$_3$), the synthesis of which has been described by R. J. Logan et al. in J. Chem. Soc., Chem. Commun. (1968) 271.

Rhodium oxide is preferably grown by ALD for example from following rhodium compounds:
2,4-pentanedionatorhodium(I)dicarbonyl ($C_5H_7$Rh(CO)$_2$), tris(2,4-pentanedionato)rhodium i.e. rhodium(III)acetylacetonate (Rh($C_5H_7O_2$)$_3$), and tris(trifluoro-2,4-pentanedionato)rhodium.

Iridium oxide is preferably grown by ALD for example from following iridium compounds:
(methylcyclopentadienyl)(1,5-cyclooctadiene)iridium(I) ([($CH_3$)$C_5H_4$]($C_8H_{12}$)Ir) and trisallyliridium (($C_3H_5$)$_3$Ir).

Nickel oxide is preferably grown by ALD for example from following nickel compounds:
nickel carbonyl (Ni(CO)$_4$), bis(2,2,6,6-tetramethyl-3,5-heptanedionato)nickel(II) (Ni(DPM)$_2$, or Ni(thd)$_2$, or Ni($C_{11}H_{19}O_2$)$_2$), nickel(II)acetylacetonate, also known as bis(2,4-pentanedionato)nickel(II), nickel(II)trifluoroacetylacetonate, nickel(II)hexafluoroacetylacetonate (Ni(CF$_3$COCHCOCF$_3$)$_2$), nickel(II)dimethylglyoxime (Ni(HC$_4$H$_6$N$_2$O$_2$)$_2$), and tetrakis(trifluorophosphine)nickel (O) (Ni(PF$_3$)$_4$).

Palladium oxide is preferably grown by ALD for example from following palladium compounds: Pd(thd)$_2$ and bis(1,1,1,5,5,5-hexafluoro-2,4-pentanedionato)palladium (Pd(CF$_3$COCHCOCF$_3$)$_2$).

Platinum oxide is preferably grown by ALD for example from following platinum compounds:
platinum(II)hexafluoroacetylacetonate (Pt(CF$_3$COCHCOCF$_3$)$_2$), (trimethyl)methylcyclopentadienylplatinum(IV) (($CH_3$)$_3$($CH_3C_5H_4$)Pt), and allylcyclopentadienylplatinum (($C_3H_5$)($C_5H_5$)Pt).

Copper oxide is preferably grown by ALD for example from the following copper compounds and their derivatives: CuCl, CuBr, CuI, bis(6,6,7,7,8,8,8-heptafluoro-2,2-dimethyl-3,5-octanedionato)copper(II) (Cu(FOD)$_2$), bis(2,2,6,6-tetramethyl-3,5-heptanedionato)copper(II) (Cu(TMHD)$_2$, or Cu(DPM)$_2$, or Cu(thd)$_2$), copper(II)acetylacetonate (Cu(CH$_3$COCHCOCH$_3$)$_2$), also known as Cu(acac)$_2$, derivatives of Cu(acac)$_2$ such as alkyl derivatives of Cu(acac)$_2$, copper(II)trifluoroacetylacetonate (Cu(CF$_3$COCHCOCH$_3$)$_2$), copper(II)hexafluoroacetylacetonate (Cu(CF$_3$COCHCOCF$_3$)$_2$), hexafluoroacetylacetonatocopper(I) trimethylphosphine adduct (Cu(CF$_3$COCHCOCF$_3$)P(CH$_3$)$_3$), copper(II)beta-ketoiminates, copper(II)beta-diketiminates such as bis(N,N'-Dialkyl-1,3-alkyldiketiminato)copper(II), e.g. bis(N,N'-Diethyl-1,3-propanediketiminato)copper(II), (N,N'-Dialkyl-2-alkyl-amidinato)copper(I) complexes such as (N,N'-Diisopropylacetamidinato)copper (I) dimer [Cu($^i$Pr-MeAMD)]$_2$, the synthesis of which has been described by B. S. Lim et al. (Inorganic Chemistry (2003) pp. 7951–7958, incorporated by reference herein), copper(II)dialkylaminoalkoxides such as copper(II)dimethylaminoethoxide, cyclopentadienylcopper(I)triethylphosphine $((C_5H_5)Cu:P(C_2H_5)_3)$, ethylcyclopentadienylcopper triphenylphosphine adduct $((C_2H_5C_5H_4)Cu:P(C_6H_5)_3)$, hexafluoroacetylacetonatocopper(I)triethylphosphine adduct $((C_5HF_6O_2)Cu:P(C_2H_5)_3)$, hexafluoroacetylacetonatocopper(I)$_2$-butyne adduct $((C_5HF_6O_2)Cu:CH_3C\equiv CCH_3)$, hexafluoroacetylacetonatocopper(I) 1,5-cyclooctadiene adduct $((C_5HF_6O_2)Cu:C_8H_{12})$, hexafluoropentanedionatocopper(I)vinyltrimethylsilane adduct, and anhydrous copper nitrate $(Cu(NO_3)_2)$, the synthesis of which has been described by C. C. Addison et al. (J. Chem. Soc. (1958) pp. 3099–3106, incorporated by reference herein).

Silver oxide is preferably grown by ALD for example from hexafluoroacetylacetonatosilver trimethylphosphine adduct $((C_5HF_6O_2)Ag:P(CH_3)_3)$.

Gold oxide is preferably grown by ALD for example from following gold compounds:

gold(III)fluoride $AuF_3$, dimethyl(acetylacetonato)gold(III) $((CH_3)_2(C_5H_7O_2)Au)$, and
dimethylhexafluoroacetylacetonatogold $((CH_3)_2Au(C_5HF_6O_2))$.

The oxygen source material used in the method of certain embodiments is selected from a group of volatile or gaseous compounds that contain oxygen and are capable of reacting with an adsorbed metal compound on the substrate surface, at the deposition conditions, resulting in growth of metal oxide thin film on the substrate surface.

It is to be noted that Re, Ru and Os form highly volatile oxides when reacting with strong oxidizing agents. It is therefore preferable to exclude strong oxidizing agents from the vicinity of the substrate when growing lower oxidation state oxides of Re, Ru and Os.

In the production of a metal oxide thin film on a wafer the oxygen source chemical is selected for example from a group consisting of water $(H_2O)$, hydrogen peroxide $(H_2O_2)$, oxygen $(O_2)$, ozone $(O_3)$, singlet oxygen $^1O_2$, and oxygen compounds with unpaired electrons, as well as oxygen radicals and OH radicals.

A special group of oxygen source chemicals can be used when the metal source chemical is an anhydrous metal nitrate. This group of oxygen chemicals consists of an aqueous solution of ammonia $(NH_3*H_2O$ or $NH_4OH)$, an aqueous solution of hydroxylamine $(NH_2OH*H_2O)$, and an aqueous solution of hydrazine $(N_2H_{4*}H_2O)$.

Mixtures of at least two oxygen source chemicals can also be used for metal oxide deposition. Especially in case of ozone, the substrate surface may remain too "dry" (i.e., the surface contains too few —OH groups) and the number of active surface sites (especially —OH groups) will drop below an optimum value. By adding a certain amount of water vapor to the ozone pulse, the number of —OH groups on the surface can be increased and the growth rate of the metal oxide thin film can be improved. Alternatively, water vapor can be pulsed after the $O_3$ pulse to achieve the same result as with the water-ozone pulse.

Reduction Process

According to certain embodiments described herein, the metal oxide thin film that is to be reduced into a metal thin film consists essentially of a metal oxide or a mixture of metal oxides. The method of reducing the metal oxide layer plays a very important role in certain embodiments described herein. The metal oxide is reduced in certain embodiments by means of gaseous inorganic reducing agents, such as thermal hydrogen $(H_2)$, hydrogen plasma (H radicals), carbon monoxide (CO) or gaseous mixtures of said reducing agents optionally diluted with inactive gases, such as He. "Thermal hydrogen" means that hydrogen is in molecular form $(H_2)$ and the hydrogen molecules have not been excited into radicals. Surprisingly, good adhesion of the reduced metal oxide thin film on the substrate is preserved when the above mentioned inorganic reducing agents are used under specified process conditions.

In certain embodiments, the conversion step is preferably done with a reducing agent capable of forming a stronger bond to the oxygen of the metal oxide layer than the metal in the oxide layer. In certain preferred embodiments, the reducing agent is in gaseous form. The gaseous reducing agent is capable of taking away the oxygen that was bound to the metal oxide and thus an elemental metal is left on the substrate surface. For example, hydrogen forms water $(H_2O)$ molecules and carbon monoxide forms carbon dioxide $(CO_2)$ molecules.

The reduction process of preferred embodiments is carried out in a reaction space that enables controlled temperature, pressure and gas flow conditions. The gaseous inorganic reducing agent is fed to the reaction space, optionally with the aid of an inactive carrier gas, such as nitrogen, argon or helium. The reducing agent is contacted with the substrate, whereby the metal oxide layer is reduced at least partly to a metal layer and the reducing agent is oxidized. Typically, the reaction space is then purged with an inactive carrier gas to remove the unreacted inorganic reducing agent and gaseous reaction byproducts.

The reduction process according to certain embodiments is preferably carried out at low temperatures to avoid agglomeration of metal on the substrate surface. Theoretically, the reactions between oxide(s) and the reducing agents used in the process of certain embodiments are favorable over a wide temperature range, even as low as room temperature. Kinetic factors and the diffusion rate of oxygen and/or reducing agent in the metal oxide film set a lower limit on the actual process temperatures that can be applied economically to facilitate high enough throughput. The temperature in the reaction space is preferably in the range of about 50° C. to about 400° C., more preferably about 100° C. to about 350° C. and even more preferably about 150° C. to about 300° C.

It is to be noted that in case of very thin metal oxide films, the reduction temperature can be selected from the lower side of the temperature range. If the desired thickness of the metal oxide film is more than about 50 nm and deposition and reduction temperature are very low, thus causing a slow reduction reaction or slow diffusion of oxygen through the metal oxide layer, the deposition of the metal film can be divided into at least two parts to speed up the total processing time. One layer of the metal oxide, comprising more than one molecular monolayer of the metal oxide, preferably three or more monolayers, is deposited by ALD, then reduced into a metal layer, another layer, comprising more than one molecular monolayer of the metal oxide and preferably three or more monolayers, is deposited by ALD, then reduced into a metal layer, et cetera, until a metal film of desired thickness is obtained. Each thinner metal oxide layer is more susceptible to reduction than a single thick metal oxide layer.

The pressure in the reaction space is preferably 0.01 to about 50 mbar, more preferably 1 to 10 mbar during the deposition of the metal oxide film. During the reduction process, the pressure of the reaction space can be from about 0.1 mbar to over atmospheric pressure, more preferably about 0.5 to about 50 mbar, even more preferably about 3 to about 6 mbar.

The processing time varies according to the thickness of the layer to be reduced and the reducing conditions, including, for example, the type of reducing agent, the pressure in the reaction chamber and the temperature. However, for layers having a thickness of approximately 0.1–50 nm, the processing time is typically in the order of seconds. Layers thicker than about 50–100 nm can also be reduced in a batch process, as described above, to keep the reduction time per substrate short enough. Preferably the layer to be reduced has a thickness of at least about 0.6 nm, more preferably at least about 7 nm.

Suitable inorganic reducing agents are preferably selected from the group consisting of:

thermal hydrogen ($H_2$);
hydrogen radicals (H*); and
carbon monoxide (CO).

When hydrogen radicals are used for reducing the oxide film, the hydrogen radicals are generated via the formation of a hydrogen plasma. The plasma may be formed in situ, in the reaction chamber, or may be formed remotely and the radicals transported to the reaction chamber. The radicals are preferably generated in an atmosphere comprising about 1% to about 30% flowing hydrogen, more preferably between about 3 and about 10% flowing hydrogen and even more preferably about 3.85% flowing hydrogen. The atmosphere also preferably comprises one or more inert gases, such as He. For example, a plasma may be produced in an atmosphere comprising 3.85% hydrogen in helium by applying power to a flowing gas comprising 10 sccm $H_2$ and 250 sccm He.

The pressure in the reaction chamber for the generation of hydrogen radicals is preferably between about 1 and 10 mbar, more preferably between about 3 and 6 mbar, and even more preferably about 5.6 mbar.

A plasma power setting of about 200 to about 2000 W is typically used to generate the hydrogen radicals. In a preferred embodiment, a power setting of about 1500 W is used.

In a particularly preferred embodiment, oxide reduction is carried out using hydrogen radicals generated using a 1500 W plasma at a pressure of 5.6 mbar and a temperature of about 150° C. in an atmosphere comprising about 3.85% hydrogen in helium.

Reactors used for deposition of thin films by ALD and/or CVD are preferably used in the methods of certain embodiments described herein. However, the deposition of the metal oxide thin film and the reduction step in embodiments using inorganic reduction agents are preferably carried out sequentially in one reactor. The reduction process can also be done in a cluster tool where the substrate arrives from a previous process step, the substrate is treated with the reducing agent and then transported to the following process step. In a cluster tool the reaction space temperature of each chamber can be kept constant, which improves the throughput when compared to a reactor which is heated to the process temperature before each run.

With reference to FIG. 4, typically, the processes include cleaning 400 of a substrate that is for example a 200-mm or 300-mm silicon wafer, deposition 402 of a diffusion barrier layer on the substrate, deposition 404 of a metal oxide layer on the diffusion barrier layer, reduction 406 of the metal oxide layer into a metal layer and deposition 408 of bulk metal on the metal layer.

In an exemplary embodiment, a conformal copper oxide (CuO) film is deposited by ALD on a diffusion barrier film. Suitable diffusion barrier films for copper include, but are not limited to, TiN, Ta, TaN and WNC (tungsten nitride carbide). The CuO film has a thickness preferably at least about 0.6 nanometers, more preferably between approximately 1 nanometer and approximately 20 nanometers, and most preferably between approximately 1 nanometer and approximately 3 nanometers.

After a reduction process that removes oxygen from the copper oxide layer, the resultant Cu film can then be used as a seed layer in an ECD tool for subsequent metal layer formation. In certain embodiments, the seed layer has a resistivity of preferably between about 1 μΩ-cm and about 30 μΩ-cm, more preferably between about 1.67 μΩ-cm and about 10 μΩ-cm, and most preferably between about 1.7 μΩ-cm and about 3 μΩ-cm. Resulting structures can be used in microchip metallization such as single and dual damascene processes.

In certain preferred embodiments, the subsequent metal layer formation is performed using an ECD tool. An exemplary ECD tool comprises at least one ECD module. An example of ECD tools is LuminaCu™ system available from NuTool, Milpitas, Calif., USA. In addition, prior to the formation of the subsequent metal layer using ECD, the resulting Cu seed layer can be repaired using known seed repair technologies, such as electroless deposition processes (see, e.g., Peter Singer, "Progress in Copper: A Look Ahead," Semiconductor International, May 1, 2002, the disclosure of which is incorporated in its entirety by reference herein). The basics of electroless deposition, also known as electroless plating, have been presented by G. Mallory and J. Hadju in "Electroless Plating: Fundamentals and Applications", Noyes Publications, 1990, which is also incorporated in its entirety by reference herein.

Nickel oxide (NiO), silver oxide (AgO), cobalt oxide (CoO), palladium oxide (PdO) and ruthenium oxide ($RuO_2$) serve as examples of other metal oxides that can be reduced with the present method into metal layers to be used as seed layers for ECD.

A surprising finding related to certain embodiments described herein is that the film has very good adhesion to the substrate, even after a reduction step. The structural integrity of the metal film is preserved and the formation of pinholes in the film is avoided. While the exact nature of the interface between the metal film and the substrate is unclear, it is obvious that the interface is much stronger than in the case of direct deposition of metal films by ALD.

EXAMPLES

Example 1

ALD of Cobalt Oxide $Co(thd)_3$ and $O_3$ were used as source chemicals for the cobalt oxide deposition in an ALD reactor. $Co(thd)_3$ was heated to 110° C. $O_3$ was prepared from 99.9999% $O_2$ with an external ozone generator. The resulting oxygen source gas mixture consisted of 10–20 vol.-% $O_3$ in $O_2$. Nitrogen, evaporated from liquid nitrogen, was used as an inert purging gas. $Co(thd)_3$ pulse length varied from 1.5 s to 2.0 s, while $O_3$ pulse (flow rate 100 std.cm³/min) length varied from 2.0 s to 4.0 s. Silicon was used as the substrate material. Substrate temperatures between 150° C. and 350° C. were tested. One pulsing cycle consisted of four sequential steps: $Co(thd)_3$ pulse, $N_2$ purge, $O_3$ pulse, $N_2$ purge.

The higher deposition temperature tested resulted in uncontrolled film growth, as $Co(thd)_3$ decomposed thermally thus producing a poor thickness profile for the thin film. At the lower substrate temperatures, a controlled growth rate of the thin film (0.3 Å/cycle) and good adhesion were obtained. A total of 2000 pulsing cycles resulted in a 64 nm thick cobalt oxide layer. According to Energy Dispersive X-ray Spectroscopy (EDS) measurements the thin films consisted of CoO.

Example 2

ALD of Palladium Oxide

Substrates with Si, TiN, WN, $W_3C$ and $SiO_2$ surfaces were loaded into an F-120 ALD reactor manufactured by ASM Microchemistry Ltd., Finland. Pd(thd)$_3$ was loaded into a solid source tube of the reactor. The reactor was pumped to vacuum. The pressure of the reaction chamber was adjusted to about 5–10 mbar with flowing nitrogen gas while the pumping of the reactor continued. The Pd(thd)$_3$ was heated to 110° C. and the reaction chamber to 150° C.

One pulsing cycle consisted of four steps in the following order: Pd(thd)$_3$ pulse (2.0 s), $N_2$ purge (1.0 s), $O_3$ pulse (4.0 s), $N_2$ purge (2.0 s).

The growth rate of palladium oxide from Pd(thd)$_3$ and $O_3$ was 0.15 Å/cycle at 150° C. According to EDS the film consisted of palladium oxide. The film grew on Si, TiN, WN, $W_C$ (tungsten carbide) and $SiO_2$ surfaces and showed good adhesion.

Example 3

Thermal Hydrogen as a Reducing Agent for the Reduction of ALD-grown Copper Oxide A silicon substrate having 20 nm of thermal silicon dioxide on the surface was loaded to the reaction space of a Pulsar® 2000 ALCVD™ reactor. The pressure of the reaction space was adjusted to about 1–20 mbar with a vacuum pump and flowing nitrogen gas (claimed purity 99.9999%). The temperature of the reaction space was adjusted to about 300–315° C. Tungsten nitride carbide (WNC) thin film was deposited on the thermal $SiO_2$ from alternate pulses of $WF_6$, $NH_3$ and triethylboron (TEB). The deposition cycle consisted of $WF_6$ pulse 0.25 s, $N_2$ purge 1 s, $NH_3$ pulse 0.75 s, $N_2$ purge 1 s, TEB pulse 0.1 s and $N_2$ purge 1 s. These pulse and purge times serve as examples of suitable values for the deposition process. Typically, pulse and purge times are selected from a range of about 0.05 s–3 s. Depending on the experiment, the deposition cycle was repeated 30–150 times, resulting in a WNC thin film having a thickness of 25–120 angstroms. Details of the WNC deposition at low temperatures have been disclosed in U.S. patent application publication no. 2003/0082296, the disclosure of which is incorporated herein by reference.

Next, the substrate was transferred to another Pulsar® 2000 ALCVD™ reactor. The pressure of the reaction space was adjusted to about 1–20 mbar with a vacuum pump and flowing nitrogen gas (claimed purity 99.9999%). The temperature of the reaction space was selected from a range of about 110–140° C. Copper oxide (CuO) thin film was deposited on the WNC film from alternate pulses of Cu(acac)$_2$ and ozone ($O_3$). Ozone was formed from oxygen gas in an external oxygen generator. The flow rate of the $O_3/O_2$ mixture was set to 200 std.cm$^3$/min (200 sccm). There was about 15% of $O_3$ in $O_2$. Cu(acac)$_2$ was heated to a source temperature that was selected from a range of about 110–140° C. The deposition cycle consisted of Cu(acac)$_2$ pulse 0.1–2 s, $N_2$ purge 0.05–1 S, $O_3$ pulse 0.1–1 s and $N_2$ purge 1–3 s. These pulse and purge times serve as examples of suitable values for the deposition process. Typically, pulse and purge times are selected from a range of about 0.05 s–7 s. Depending on the experiment, the deposition cycle was repeated 5–1500 times, resulting in a CuO thin film having a thickness of about 3–350 angstroms.

Then the substrate was transferred to an Eagle® 12 reactor, commercially available from ASM Japan K.K. of Tokyo, Japan. The temperature of the reaction space was set to a value selected from a range of about 270–320° C. Lower temperatures help to avoid the agglomeration of copper metal during the reduction process. The reaction chamber was purged with nitrogen gas at lowered pressure and then the substrate was exposed to 500 sccm (std. cm$^3$/minute) of thermal $H_2$ for about 22 s for reducing the copper oxide film. As a result, smooth copper thin film was obtained on the substrate. Depending on the experiment and desired metal thickness, up to about 10 nm of Cu had excellent adhesion on the WNC. The samples passed a Scotch™ tape test. ESCA depth profiling confirmed that the copper oxide films had successfully been reduced into metallic copper film and very little oxygen was seen at the WNC/Cu interface.

Some of the copper seed samples were coated with bulk copper in an ECD tool and some of the samples received bulk copper coating in an MOCVD reactor. Bulk copper metal had excellent adhesion to the substrates.

Example 4

Reduction of Copper Oxide Using Hydrogen Plasma as a reducing Agent

After depositing WNC on thermal $SiO_2$ and CuO on the WNC, the 200 mm silicon wafer was transferred to an Eagle® 10 reactor, commercially available from ASM Japan K.K. of Tokyo, Japan, for reducing the copper oxide film with direct plasma. In one experiment 35 nm of CuO was reduced into copper film at 300° C. in 4 seconds. In other experiments 35 nm of CuO was reduced with hydrogen plasma at 150° C. in 15 s and 17 nm of CuO was reduced into copper metal with hydrogen plasma at 150° C. in 10 s. The resistivity of the resulting Cu film was lower than 10 µΩ-cm. Very uniform sheet resistance was obtained and the variation was only 2.2% over a 200 mm wafer. The film contained less than 50 ppm of Fe, Cr and Ni impurities. It is also possible to apply remote (as opposed to direct or in situ) plasma for the reduction of metal oxides, including copper oxide.

Two additional sets of experiments were performed on wafers prepared as described above.

One set of experiments was done using a 1500 W plasma at a pressure of 560 Pa and a temperature of 150° C. The set-up of these experiments can be seen in the first half of Table 1. 1000 (~35 nm) and 500 (~17 nm) cycle Cu$_x$O layers were reduced in a 20, 10 and 3.85% $H_2$ atmosphere. 1500 cycle (~30 nm, the difference in thickness could be explained by the fact that these layers were deposited at a different time under different conditions) Cu$_x$O layers were reduced in a 1 and 2% $H_2$ atmosphere and finally a 200 cycle (~7 mm) Cu$_x$O layer was reduced in a 3.85% $H_2$ atmosphere.

The second set of experiments was done using a 250 W plasma at a pressure of 300 Pa in a 3.85% $H_2$ atmosphere. The setup of these experiments can be seen in the first half of Table 2. First some trial experiments were done exposing 1000 cycle Cu$_x$O layers for a short time at 150, 200 and 300° C. After this some more extensive experiments were done on 1000 cycle $Cu_xO$ layers at 200° C. and 150° C. Also some experiments at 150° C. were done ori 200 and 500 cycle $Cu_xO$ layers.

Rs measurements were made on all wafers. In addition, the compositions of a non-reduced, a half-reduced (Table 2 no. 6) and a fully reduced layer (Table 1 no. 9) were analyzed.

All wafers had a light blue or silver color prior to reduction. The Rs measured d before reduction was most likely that of the WNC, since the values agreed and the Rs of an oxide is too high to measure. For all wafers this value was more or less the same and showed a similar pattern across the wafer.

After reduction all wafers also showed more or less the same Rs pattern across the wafer.

thermal oxide monitor wafer, a thickness of 30 nm was measured, while for the 1000 cycle layer a thickness of 35 nm was measured. This suggests that the 1500 cycle $Cu_xO$ layer is thinner than the 1000 cycle layer, which is in contradiction with the lower Rs after reduction. These results indicate that the 1500 cycle $Cu_xO$ layer is differs from the 1000 cycle layers as a result of different deposition conditions.

Figure 7:
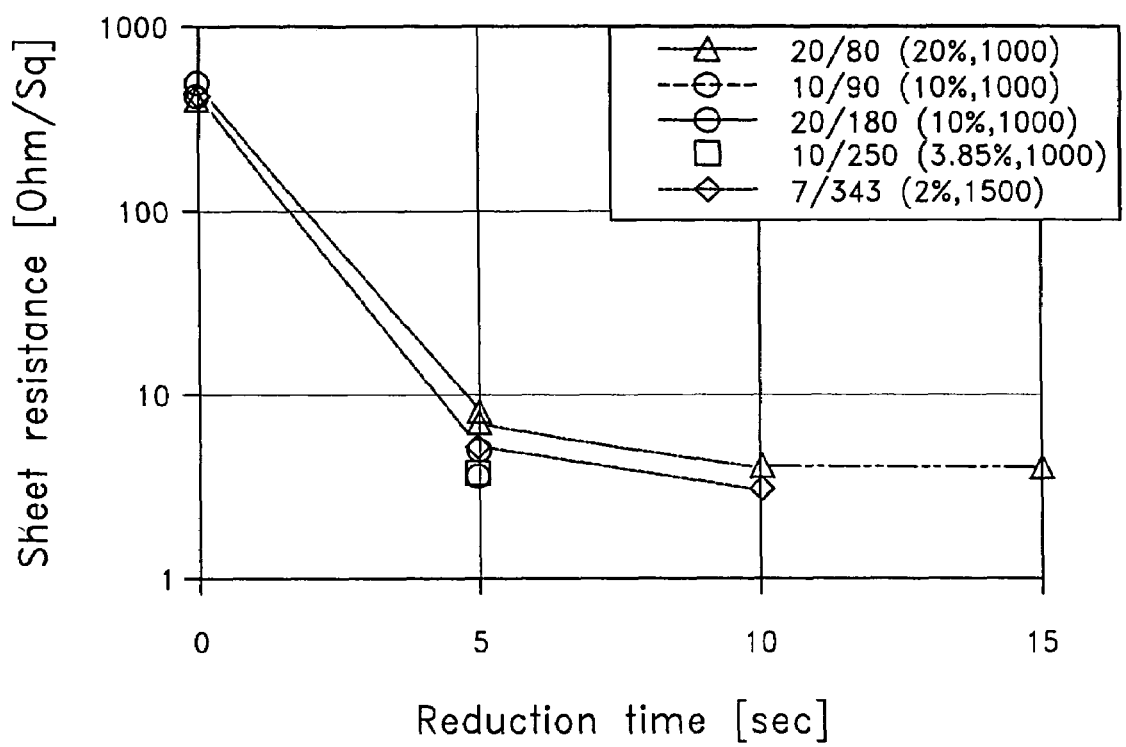
FIG. 7 depicts sheet resistance versus reduction time for 1000 and 1500 cycles of $Cu_xO$ reduced with different $H_2$ concentrations at 1500 W, 560 Pa and 150° C.

The Rs of the 1000 and 1500 cycles is plotted against the reduction time in FIG. 7, providing an indication of the Rs after reduction and the time necessary for complete reduction of the thicker $Cu_xO$ layers at different $H_2$ settings. It can be seen that for all settings the Rs after reduction is more or less the same: ~4 Ω/Sq. For the 2 and 20% $H_2$ it took a bit more time to fully reduce the wafer.

TABLE 1

Experimental Set-up and Results for PE $H_2$ Reductions at 1500 W, 560 Pa and 150° C.

| Wafer No. | CuO [cycles] | $H_2$/He [sccm] | $H_2$ [%] | Time [sec] | Before Rs [Ω/Sq] | SD [%] | After Rs [Ω/Sq] | SD [%] | Color (after) | Agglomeration |
|---|---|---|---|---|---|---|---|---|---|---|
| 1 | 1000 | 20/80 | 20 | 5 | 464 | 1.22 | 7.26 | 9.88 | blue | — |
| 2 | 1000 | 20/80 | 20 | 5 | 407 | 2.94 | 8.15 | 5.72 | copper | — |
| 3 | 1000 | 20/80 | 20 | 10 | 492 | 1.72 | 4.09 | 4.65 | blue | — |
| 4 | 1000 | 20/80 | 20 | 15 | 467 | 1.25 | 3.95 | 4.67 | blue | partial |
| 5 | 1000 | 20/180 | 10 | 5 | 466 | 1.48 | 4.89 | 3.36 | blue | partial |
| 6 | 1000 | 10/90 | 10 | 5 | 413 | 1.23 | 3.63 | 2.27 | copper | partial |
| 7 | 1000 | 10/250 | 3.85 | 5 | 387 | 2.09 | 3.71 | 4.05 | copper | no |
| 8 | 1500 | 7/353 | 2 | 5 | 419 | 0.687 | 5.24 | 18.4 | purple spot | — |
| 9 | 1500 | 7/343 | 2 | +5* | 5.24 | 18.4 | 3.01 | 3.69 | copper | holes |
| 10 | 1500 | 3.5/346.5 | 1 | 5 | 399 | 0.957 | —** | — | copper | — |
| 11 | 500 | 20/80 | 20 | 5 | 344 | 0.594 | 21.8 | 5.54 | silver | — |
| 12 | 500 | 10/90 | 10 | 5 | 427 | 1.44 | 25.4 | 4 | silver | — |
| 13 | 500 | 10/250 | 3.85 | 5 | 438 | 3.24 | 14.8 | 5.72 | silver | partial |
| 14 | 200 | 10/250 | 3.85 | 5 | 374 | 1.58 | 374 | 18.4 | silver | full |

— No measurement or examination was done
*After reducing for 5 sec. the wafer was reduced for another 5 sec.
**No Rs was measured, because the wafer was partially delaminated at the edge Table 1 shows the results of the reductions done with a plasma power of 1500 W at 560 Pa.

For 1000 cycle $Cu_xO$ layers a 10/90 sccm $H_2$/He-flow gave a better result than the 20/180 sccm $H_2$/He-flow settings at 10% $H_2$. The difference in Rs before reduction is not believed to be of any influence, since this value is solely due to the WNC barrier.

The 1500 cycle $Cu_xO$ layer had a significantly lower Rs after reduction, which is in accordance with a thicker $Cu_xO$ layer associated with the higher number of deposition cycles. However for the 1500 cycle layer deposited on a The 1000 cycle $Cu_xO$ wafer reduced with 3.85% $H_2$ showed no significant damage.

Figure 8:
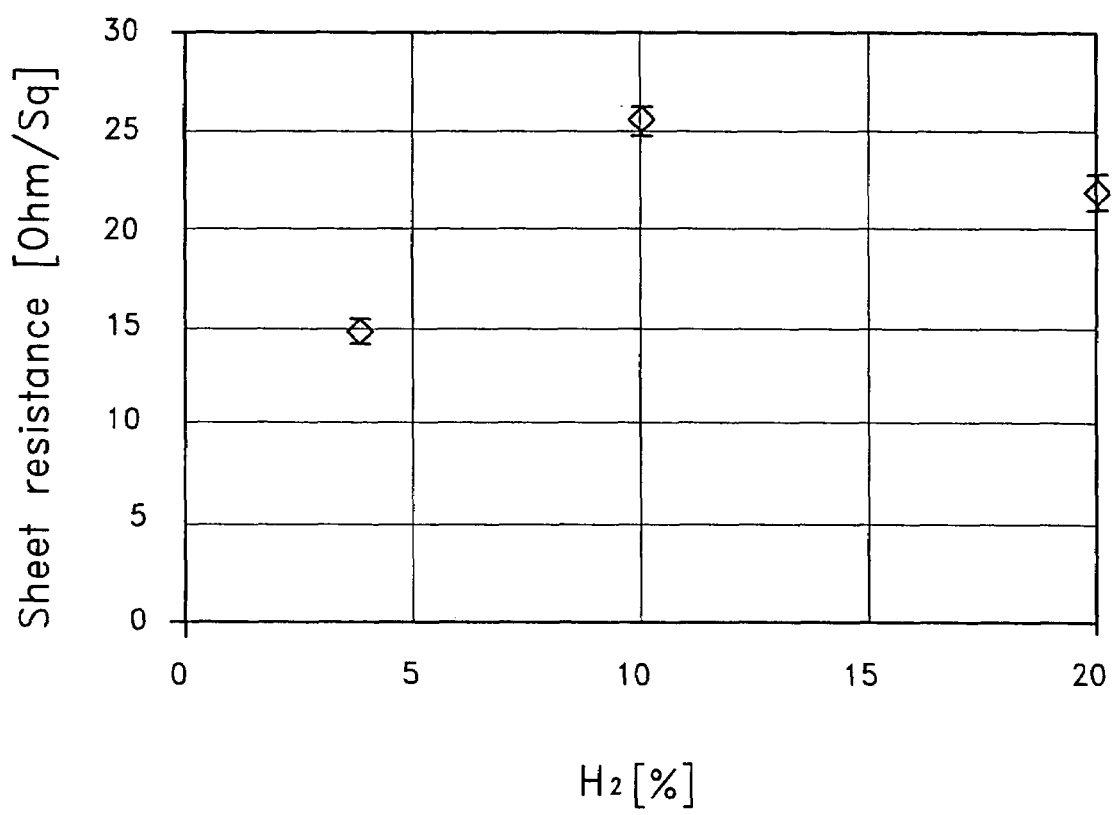
FIG. 8 depicts sheet resistance versus $H_2$ reduction concentration for 500 cycles of $Cu_xO$ reduced at 1500 W, 560 Pa and 150° C.

The 500 cycle $Cu_xO$ layers were all of the same lot, minimizing inter-wafer differences. In FIG. 8 the Rs of the reduced wafers is plotted against the percentage of $H_2$. The 3.85% $H_2$ gave the best result of ~15 ΩSq, followed by the 20% $H_2$ and the 10% $H_2$ gave the highest Rs.

For the 200 cycle $Cu_xO$ layer no change in Rs was measured. However, SEM pictures indicated that the layer was completely agglomerated. This suggests that the layer was both reduced and agglomerated at the same time.

TABLE 2

Experimental Set-up and Results for PE $H_2$ Reductions at 250 W, 300 Pa and 3.85% $H_2$

| No. | CuO [cycles] | Temp [° C.] | Time [sec] | Before Rs [Ω/Sq] | SD [%] | After Rs [Ω/Sq] | SD [%] | Color (after) | Agglomeration |
|---|---|---|---|---|---|---|---|---|---|
| 1 | 1000 | 150 | 10 | 464 | 1.37 | 464 | 1.38 | yellow spot | — |
| 2 | 1000 | 300 | 10 | 474 | 1.68 | 577 | 6.66 | yellow spot | — |
| 3 | 1000 | 200 | 10 | 160* | 0.989 | 160 | 1.03 | yellow spot | Holes |
| 4 | 1000 | 200 | 30 | 160* | 1.01 | 90.9 | 88.0 | yellow spot | — |
| 5 | 1000 | 200 | +30** | 90.9 | 88.0 | 4.13 | 6.14 | silver | Holes |

TABLE 2-continued

Experimental Set-up and Results for PE $H_2$ Reductions at 250 W, 300 Pa and 3.85% $H_2$

| | | | | Before | | After | | | |
|---|---|---|---|---|---|---|---|---|---|
| No. | CuO [cycles] | Temp [° C.] | Time [sec] | Rs [Ω/Sq] | SD [%] | Rs [Ω/Sq] | SD [%] | Color (after) | Agglomeration |
| 6 | 1000 | 200 | 30 | 517 | 5.25 | 198 | 110 | purple spot | Holes |
| 7 | 1000 | 200 | 45 | 415 | 1.10 | 3.74 | 3.04 | copper | — |
| 8 | 1000 | 150 | 45 | 398 | 2.12 | 3.75 | 4.34 | copper | Holes |
| 9 | 500 | 150 | 15 | 386 | 0.720 | 389 | 5.53 | brown spot | — |
| 10 | 500 | 150 | 25 | 398 | 0.963 | 24.7 | 3.64 | silver | Partial |
| 11 | 500 | 150 | 35 | 510 | 5.64 | 24.9 | 1.06 | silver | — |
| 12 | 200 | 150 | 15 | 456 | 2.40 | 454 | 2.39 | silver | — |
| 13 | 200 | 150 | 25 | 392 | 1.16 | 390 | 1.17 | silver | — |

— No examination was done
*300 cycles WNC instead of 150 cycles
**After reducing for 30 sec. the wafer was reduced for another 30 sec.

Table 2 shows the results of reduction of $Cu_xO$ layers with a plasma power of 250 at 300 Pa. Here, as in the experiments with 1500 W power, different wafer lots resulted a different color after reduction. All half-reduced wafers showed a colored spot in the middle of the wafer, while the edge already had the color of the fully reduced wafer. Only the wafer of experiment 2 had a dark blue color on the edge. Experiments no. 3 and 4, in which wafers of the same lot were used, showed a lower Rs before reduction. The Rs found for these wafers, is in accordance with a 300 cycle WNC layer.

The first experiments consisted of exposing a 1000 cycle $Cu_xO$ layer for a short time at 150, 200 and 300° C. These experiments showed that 10 seconds was too short to reduce the 1000 cycle $Cu_xO$ layer. For this reason some more extensive experiments were done, in which a 1000 cycle $Cu_xO$ layer was exposed to the reducing agent for a longer time at 200° C. and once at 150° C.

Figure 9:
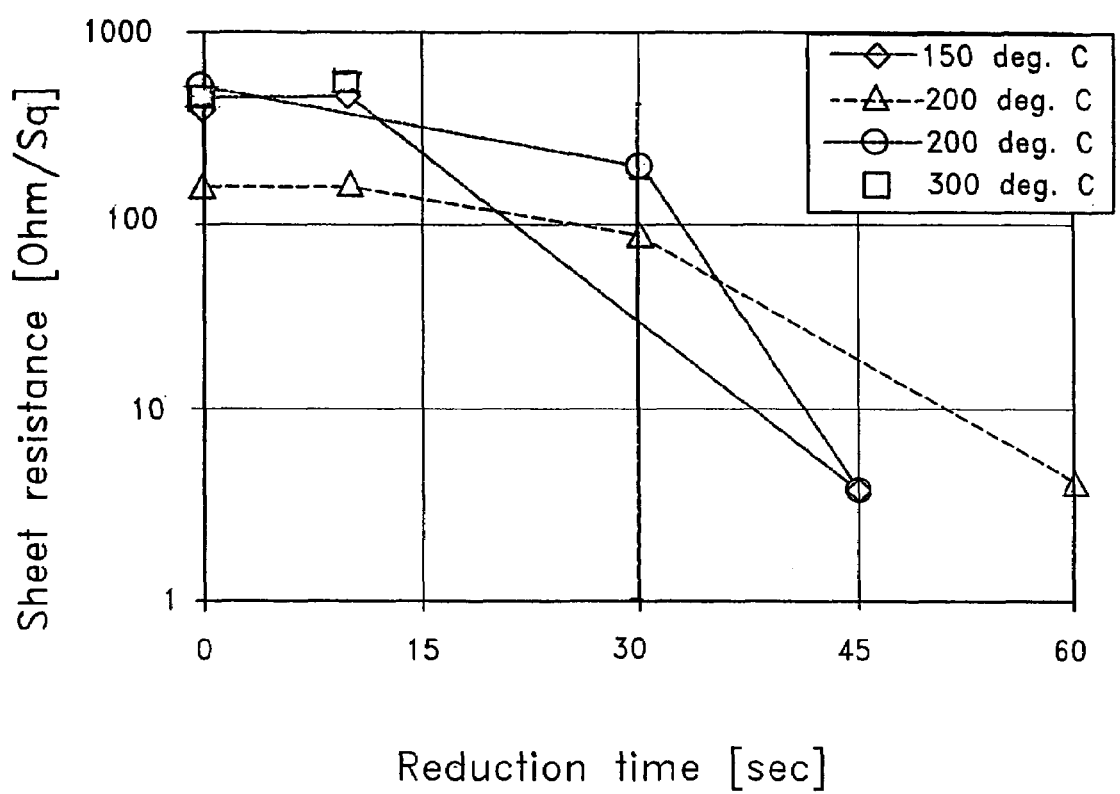
FIG. 9 depicts sheet resistance versus reduction time for 1000 cycles if $Cu_xO$ reduced at 250 W, 560 Pa and at different temperatures.

In FIG. 9, the Rs of the 1000 cycle $Cu_xO$ layers is plotted against the reduction time. It can be seen that, for 200° C. it takes about 45 seconds to fully reduce the layer and reach a value of ~4 Ω/sq. After 30 seconds a wide spread across the wafer can be seen, this is reflected in the standard deviation. The same increase in Rs was seen after a 10 second reduction at 300° C.

The wafer reduced at a temperature of 150° C. also seemed to be reduced in 45 seconds, because an Rs of ~4 Ω/sq. was reached. However the Rs plot still showed a somewhat circular pattern, which indicates that the $Cu_xO$ was not completely reduced yet.

Figure 10:
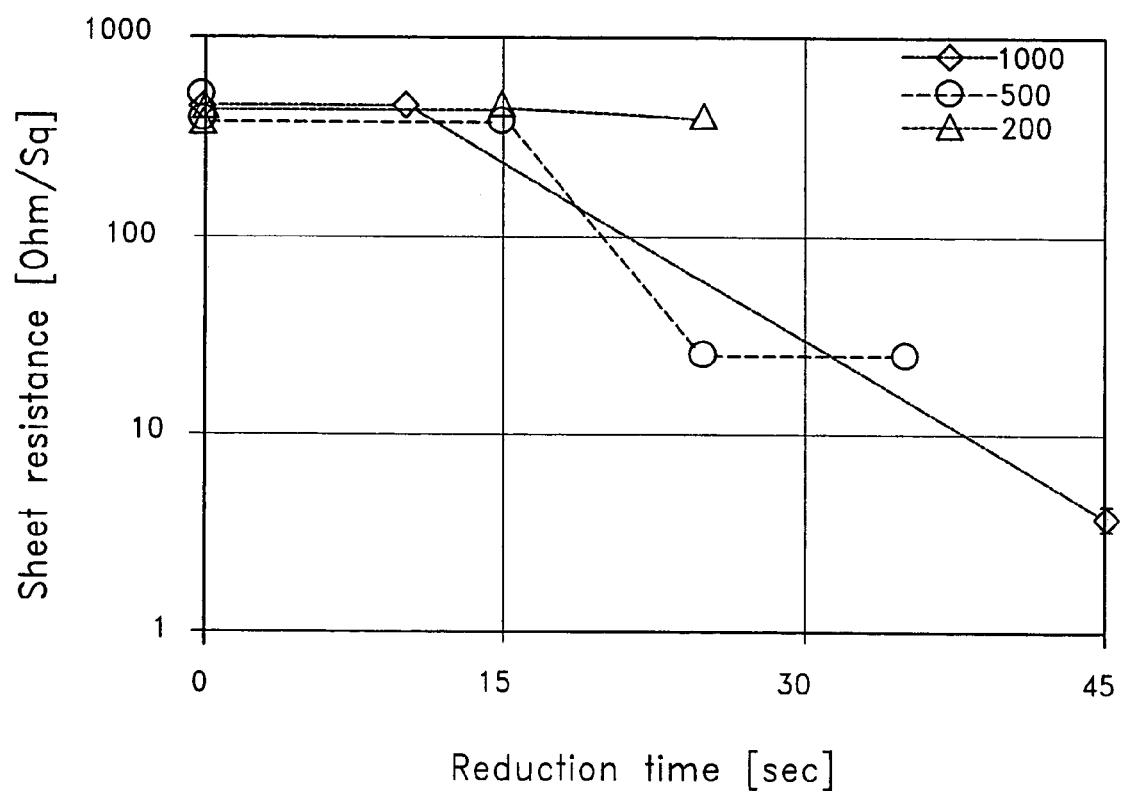
FIG. 10 depicts sheet resistance versus reduction time for different numbers of cycles of $Cu_xO$ reduced at 250 W, 560 Pa and 150° C.

FIG. 10 shows the Rs plotted against the reduction time for the different cycle numbers of the $Cu_xO$ deposition. The reaction temperature was 150° C. There is a clear dependence on $Cu_xO$ layer thickness. For the 500 cycle $Cu_xO$ layer it takes 25 seconds to fully reduce the layer and reach an Rs of ~26 Ω/sq. where it levels off. This higher Rs is probably caused by both an increased electron surface-scattering and partial agglomeration. The Rs of the 200 cycle $Cu_xO$ layer hardly changes. This is probably caused by total agglomeration of the Cu layer so no current path through the copper is available anymore and the only thing that can be measured is the sheet resistance of the underlying barrier.

For plasma enhanced $H_2$ reduction of ~35 nm $Cu_xO$ layers no significant differences were found in Rs for different percentages of $H_2$ or different power settings at 150° C. For all settings an Rs of ~4 Ω/sq. was reached. The best result was obtained with a 1500 W plasma at 560 Pa and 3.85% $H_2$. This was the only layer that did not show any significant damage. However, a big difference in reduction time was found between the different plasma settings. For the 1500 W plasma at 450 Pa, 5 to 10 seconds were needed to fully reduce a layer. On the other hand, for the 250 W plasma at 300 Pa it took slightly more than 45 seconds.

For ~17 nm $Cu_xO$ layers, differences were seen at 150° C. for different percentages $H_2$ and different power settings. The best result was again obtained with a 1500 W plasma at 560 Pa and 3.85% $H_2$. The reduced layer showed small holes and the start of agglomeration, but this did not seem to influence the resistance much, as it was only ~15 Ω/sq. The 250 W plasma at 300 Pa and 3.85% $H_2$ and the 1500 W at 560 Pa and 10% $H_2$ preformed the worst with an Rs of ~25 Ω/sq. It was not possible to reduce ~7 nm $Cu_xO$ layers without complete agglomeration.

Analyses showed that the $Cu_xO$ layer was a mixture of CuO and $Cu_2O$. It also showed that the plasma enhanced $H_2$ reduction is a 3-step top-down process. First all CuO is reduced to $Cu_2O$. This is then reduced to a mixture of $Cu_2O$ and Cu, which is finally reduced to pure Cu. During this process a thickness reduction of over 50% is observed.

A comparison between the reduction results obtained with thermal hydrogen and hydrogen plasma shows that the reduction with hydrogen plasma was much faster and could be done at a lower process temperature than with thermal hydrogen.

Example 5

Processing in a Cluster Tool Including Reduction of Copper Oxide Using Hydrogen Plasma as a Reducing Agent FIG. 5 schematically illustrates a first cluster tool 500 in accordance with embodiments described herein. The substrate is cleaned (e.g., sputter-cleaned using nitrogen, ammonia, or argon plasma) in a first reaction chamber (i.e., process module) 530 of the cluster tool 500. The substrate is then moved to a second reaction chamber 540 of the cluster tool 500, in which a diffusion barrier layer, for example tungsten nitride carbide (WNC), is deposited by ALD on the substrate. The thickness of WNC can be selected, e.g., from the range of 1–6 nm. The first cluster tool 500 further comprises a vacuum transport module 520 and one or more load locks 510, 550 to transfer the substrate to and from the cluster tool 500.

A barrier processing sequence in which the diffusion barrier is deposited before sputter-cleaning of the vias is also possible. The benefit of this type of processing sequence is that copper removed from the via bottom during the cleaning step cannot contaminate the via walls because the sidewalls are covered with the copper diffusion barrier as the Cu at the bottom of the via is cleaned by the directional etch.

FIG. 6 schematically illustrates a second cluster tool 600 in accordance with embodiments described herein. The substrate is transported from the first cluster tool 500 (FIG. 5) to the next processing unit, e.g., a second cluster tool 600. In this embodiment the substrate is moved to a first reaction chamber 630 of the second cluster tool 600 in which copper oxide (CuO and/or $Cu_2O$) is deposited by ALD on the diffusion barrier surface (e.g., WNC). The thickness of copper oxide can be selected, e.g., from a range of 0.6–10 nm. After that the substrate is moved to a second reaction chamber 640 of the second cluster tool 600 and copper oxide is reduced into copper metal, for example with thermal $H_2$, hydrogen radicals or carbon monoxide. After the reduction process the substrate is moved to a third reaction chamber 650 of the second cluster tool 600 and an MOCVD or copper superfill process is used for depositing bulk copper metal on the copper seed layer. The second cluster tool 600 further comprises one or more load locks 610, 660 and a vacuum transport module 620. According to another embodiment the substrate is transported from the second reaction chamber 640 to an ECD tool (not shown) for depositing bulk copper metal on the copper seed layer so that vias and trenches are filled with the bulk copper metal. Advantageously, ECD tools are typically less costly than an MOCVD bulk copper cluster tool.

In the ECD tool the substrate is placed in a electroplating solution that contains a water-soluble copper compound, some acid to lower the pH of the solution, and standard additives that are commonly used to improve the quality of the growing copper film. A voltage is applied between the substrate and an opposing electrode. Copper is deposited from the solution on the seed layer, and vias and trenches become filled with copper metal. The opposing electrode consists of pure copper that dissolves into the electroplating solution during the electroplating process. After the electroplating process, the substrate is rinsed to remove residual electroplating solution. The substrate is then ready for chemical mechanical polishing (CMP).

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A method of producing a conductive thin film, comprising:
    depositing a metal oxide thin film on a substrate by an atomic layer deposition (ALD) process; and
    at least partially reducing the metal oxide thin film by exposing the metal oxide thin film to hydrogen radicals, thereby forming a metal layer, wherein the hydrogen radicals are generated in an atmosphere comprising between about 3 and about 10% flowing hydrogen.

2. The method of claim 1, wherein the metal oxide thin film is at least 0.6 nanometers thick.

3. The method of claim 1, wherein the metal oxide thin film has a thickness between approximately 1 nanometer and approximately 20 nanometers.

4. The method of claim 1, wherein the metal oxide thin film has a thickness between approximately 1 nanometer and approximately 3 nanometers.

5. The method of claim 1, wherein depositing comprises at least three cycles of the ALD process.

6. The method of claim 1, wherein the metal oxide thin film is selected from the group consisting of $ReO_2$, $Re_2O_5$, $ReO_3$, $RuO_2$, $OsO_2$, $CoO$, $Co_3O_4$, $Rh_2O_3$, $RhO_2$, $IrO_2$, $NiO$, $PdO$, $PtO_2$, $Cu_2O$, $CuO$, $AgO$, $Ag_2O$, and $Au_2O_3$.

7. The method of claim 1, wherein the ALD process comprises feeding into the reaction chamber and contacting the substrate with alternating vapor phase pulses of at least one first source chemical comprising a compound capable of adsorbing no more than a molecular monolayer of metal species on the substrate and at least one second source chemical comprising a compound capable of oxidizing the metal species on the substrate into the metal oxide.

8. The method of claim 7, wherein the first source chemical is $Cu(thd)_2$ and the second source chemical is selected from the group consisting of ozone ($O_3$), oxygen ($O_2$) and a mixture of $O_3$ and $O_2$.

9. The method of claim 7, wherein the first source chemical is copper(II)acetylacetonate $Cu(acac)_2$ and the second source chemical is selected from the group consisting of ozone ($O_3$), oxygen ($O_2$) and a mixture of $O_3$ and $O_2$.

10. The method of claim 7, wherein the first source chemical is $Co(thd)_3$ and the second source chemical is selected from the group consisting of ozone ($O_3$), oxygen ($O_2$), and a mixture of $O_3$ and $O_2$.

11. The method of claim 7, wherein the first source chemical is $Pd(thd)_3$ and the second source chemical is selected from the group consisting of ozone ($O_3$), oxygen ($O_2$), and a mixture of $O_3$ and $O_2$.

12. The method of claim 1, wherein the substrate comprises a barrier film and the metal oxide thin film is deposited onto the barrier film.

13. The method of claim 12, wherein the barrier film comprises a material selected from the group consisting of TiN, Ta, TaN and WNC.

14. The method of claim 1, further comprising depositing metal onto the metal layer by an electrochemical deposition (ECD) process in an ECD tool.

15. The method of claim 14, further comprising repairing the metal layer prior to the ECD process.

16. The method of claim 1, further comprising depositing metal onto the metal layer by a metal organic chemical vapor deposition (MOCVD) process in a CVD tool.

17. The method of claim 1, further comprising depositing metal onto the metal layer by a copper superfill process in the CVD tool.

18. The method of claim 1, wherein reducing the metal oxide thin film essentially converts the metal oxide into an elemental metal seed layer which has sufficient electrical conductivity to be used for subsequent electrochemical deposition.

19. The method of claim 1, wherein reducing the metal oxide thin film essentially converts the metal oxide into an elemental metal to provide sufficient electrical conductivity to be used as an electrode of a capacitor.

20. The method of claim 1, wherein the metal layer has a resistivity between about 1 $\mu\Omega$-cm and about 30 $\mu\Omega$-cm.

21. The method of claim 1, wherein the metal layer has a resistivity between about 1.67 μΩ-cm and about 10 μΩ-cm.

22. The method of claim 1, wherein the metal layer has a resistivity between about 1.7 μΩ-cm and about 3 μΩ-cm.

23. A method of producing a conductive thin film comprising the steps of:
   A. placing a substrate in a chamber;
   B. exposing the substrate to a vapor phase first reactant, wherein the first reactant adsorbs no more than a molecular monolayer of metal species on the substrate;
   C. removing excess first reactant and gaseous reaction byproducts from the chamber;
   D. exposing the substrate to a second vapor phase reactant comprising a compound that is capable of oxidizing the adsorbed metal species on the substrate into metal oxide;
   E. removing excess second reactant and gaseous reaction byproducts from the chamber;
   F. repeating the above steps B through E at least three times to form a metal oxide film; and
   G. following step F, exposing the substrate to hydrogen radicals to reduce the metal oxide film to metal, wherein the hydrogen radicals are generated in an atmosphere comprising between about 3 and about 10% flowing hydrogen.

24. The method of claim 23, wherein in step F, is repeated at least 10 times to form the metal oxide film prior to step G.

25. A method of producing an electrically conductive thin film, comprising:
   depositing a metal oxide thin film on a partially fabricated integrated circuit by an atomic layer deposition (ALD) process, the metal oxide thin film having a thickness of at least 0.6 nm; and
   at least partially reducing the metal oxide thin film to elemental metal by exposing the metal oxide thin film to hydrogen radicals, wherein the hydrogen radicals are generated in an atmosphere comprising between about 3 and about 10% flowing hydrogen.

26. The method of claim 25, wherein depositing the metal oxide thin film comprises an atomic layer deposition process.

27. The method of claim 25, wherein the reduction temperature is between about 80° C. and about 350° C.

28. The method of claim 27, wherein the reduction temperature is between about 150° C. and about 300° C.

29. The method of claim 28, wherein the reduction temperature is between about 200° C. and about 300° C.

30. The method of claim 25, wherein the metal layer is used as a seed layer for a subsequent metal deposition.

31. The method of claim 25, wherein the hydrogen radicals are generated in an atmosphere comprising about 3.85% flowing hydrogen.

32. The method of claim 25, wherein the hydrogen radicals are generated at a plasma power setting of about 200 to about 2000 W.

33. The method of claim 32, wherein the hydrogen radicals are generated at a plasma power setting of about 1500 W.

34. The method of claim 25, wherein the hydrogen radicals are generated by applying a power of 1500 W to an atmosphere comprising about 3.85% flowing hydrogen.

* * * * *

UNITED STATES PATENT AND TRADEMARK OFFICE
CERTIFICATE OF CORRECTION

PATENT NO. : 7,067,407 B2  Page 1 of 1
APPLICATION NO. : 10/910881
DATED : June 27, 2006
INVENTOR(S) : Juhana Kostamo and Maarten Stokhof It is certified that error appears in the above-identified patent and that said Letters Patent is hereby corrected as shown below:

Title Page;
On page 2, Col. 1 (Other Publications), line 27, please delete "FeRam," and insert --FeRAM--, therefor.
In Col. 11, line 46 (approx.), please delete "($N_2H_4*H_2O$)." and insert --($N_2H_4*H_2O$).--, therefor.
In Col. 15, line 27, please delete "$W_c$" and insert --$W_xC$--, therefor.
In Col. 16, line 1, please delete "0.05-1 S" and insert --0.05-1 s,--, therefor.
In Col. 16, line 61, please delete "(~7 mm)" and insert --(~7 nm)--, therefor.
In Col. 17, line 2, please delete "ori" and insert --on--, therefor.
In Col. 17, line 9, after "measured" please delete "d".
In Col. 19, line 22 (approx.), please delete "250 at" and insert --250 W at--, therefor.

Signed and Sealed this

Fourteenth Day of August, 2007

JON W. DUDAS
*Director of the United States Patent and Trademark Office*